United States Patent
Shirakawa et al.

(10) Patent No.: US 12,471,303 B2
(45) Date of Patent: Nov. 11, 2025

(54) SEMICONDUCTOR DEVICE HAVING AN INJECTION SUPPRESSION REGION

(71) Applicant: FUJI ELECTRIC CO., LTD., Kawasaki (JP)

(72) Inventors: Tohru Shirakawa, Matsumoto (JP); Daisuke Ozaki, Okaya (JP); Yasunori Agata, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 523 days.

(21) Appl. No.: 17/646,136

(22) Filed: Dec. 27, 2021

(65) Prior Publication Data

US 2022/0149191 A1    May 12, 2022

Related U.S. Application Data

(63) Continuation of application No. PCT/JP2020/044532, filed on Nov. 30, 2020.

(30) Foreign Application Priority Data

Jan. 17, 2020  (JP) .................................. 2020-006095
May 14, 2020  (JP) .................................. 2020-085521

(51) Int. Cl.
*H10D 12/00*  (2025.01)
*H10D 8/00*  (2025.01)
(Continued)

(52) U.S. Cl.
CPC ........... *H10D 12/481* (2025.01); *H10D 8/422* (2025.01); *H10D 12/038* (2025.01); *H10D 62/127* (2025.01); *H10D 62/142* (2025.01)

(58) Field of Classification Search
CPC ............. H01L 29/7395; H01L 29/7396; H01L 29/7397; H01L 27/0705; H01L 27/0727;
(Continued)

(56) References Cited

U.S. PATENT DOCUMENTS

2005/0017290 A1    1/2005 Takahashi
2005/0045960 A1    3/2005 Takahashi
(Continued)

FOREIGN PATENT DOCUMENTS

CN    108695380 A    10/2018
CN    109478570 A    3/2019
(Continued)

OTHER PUBLICATIONS

International Search Report and (ISA/237) Written Opinion of the International Search Authority for International Patent Application No. PCT/JP2020/044532, mailed by the Japan Patent Office on Mar. 2, 2021.
(Continued)

*Primary Examiner* — Julio J Maldonado
*Assistant Examiner* — Pinaki Das

(57) ABSTRACT

Provided is a semiconductor device which includes a semiconductor substrate including a transistor portion and a diode portion. The transistor portion includes an injection suppression region that suppresses injection of a carrier of a second conductivity type at an end portion on the diode portion side in a top view of the semiconductor substrate. Both the transistor portion and the diode portion include a base region of a second conductivity type on a front surface of the semiconductor substrate, the transistor portion further includes an emitter region of a first conductivity type and an extraction region of a second conductivity type having a higher doping concentration than the base region on the front surface of the semiconductor substrate, and the injection suppression region is not provided with the emitter region and the extraction region.

15 Claims, 23 Drawing Sheets

(51) Int. Cl.
*H10D 12/01* (2025.01)
*H10D 62/10* (2025.01)
*H10D 62/13* (2025.01)

(58) Field of Classification Search
CPC ........... H01L 29/66712; H01L 29/7804; H01L 29/7805; H01L 27/0617; H01L 27/0629; H10D 12/441–491; H10D 12/038; H10D 84/143; H10D 84/144
See application file for complete search history.

(56) References Cited

U.S. PATENT DOCUMENTS

| | | |
|---|---|---|
| 2009/0001411 A1 | 1/2009 | Tokura |
| 2010/0156506 A1 | 6/2010 | Tsuzuki |
| 2012/0043582 A1 | 2/2012 | Koyama |
| 2012/0132954 A1 | 5/2012 | Kouno |
| 2013/0009206 A1 | 1/2013 | Soeno |
| 2013/0087829 A1 | 4/2013 | Tanabe |
| 2014/0070266 A1 | 3/2014 | Matsudai |
| 2014/0084337 A1 | 3/2014 | Matsudai |
| 2014/0361333 A1 | 12/2014 | Kimura |
| 2016/0141400 A1 | 5/2016 | Takahashi |
| 2016/0247808 A1 | 8/2016 | Horiuchi |
| 2016/0329323 A1 | 11/2016 | Iwasaki |
| 2016/0351561 A1 | 12/2016 | Senoo |
| 2017/0025410 A1* | 1/2017 | Cheng ................. H01L 29/0834 |
| 2017/0162560 A1 | 6/2017 | Takahashi |
| 2017/0263603 A1 | 9/2017 | Hata |
| 2018/0047725 A1* | 2/2018 | Yoshida ................ H01L 29/32 |
| 2018/0108737 A1* | 4/2018 | Naito ................. H01L 29/8613 |
| 2018/0286943 A1 | 10/2018 | Naito |
| 2019/0074367 A1 | 3/2019 | Naito |
| 2019/0157264 A1 | 5/2019 | Yoshida |
| 2019/0252374 A1 | 8/2019 | Kanetake |
| 2019/0287961 A1 | 9/2019 | Naito |
| 2020/0035817 A1 | 1/2020 | Tamura |
| 2020/0091329 A1 | 3/2020 | Mitsuzuka |

FOREIGN PATENT DOCUMENTS

| | | |
|---|---|---|
| CN | 110164966 A | 8/2019 |
| JP | 2005101514 A | 4/2005 |
| JP | 2007227982 A | 9/2007 |
| JP | 2008192737 A | 8/2008 |
| JP | 2012043891 A | 3/2012 |
| JP | 2012156564 A | 8/2012 |
| JP | 2012182391 A | 9/2012 |
| JP | 2013152996 A | 8/2013 |
| JP | 2014056942 A | 3/2014 |
| JP | 2014103376 A | 6/2014 |
| JP | 2017147431 A | 8/2017 |
| JP | 2017147435 A | 8/2017 |
| JP | 2019161168 A | 9/2019 |
| WO | 2015068203 A1 | 5/2015 |
| WO | 2016030966 A1 | 3/2016 |
| WO | 2018092738 A1 | 5/2018 |
| WO | 2019078131 A1 | 4/2019 |
| WO | 2019116748 A1 | 6/2019 |

OTHER PUBLICATIONS

Office Action issued for counterpart German Application 112020002890.9, issued the German Patent and Trademark Office on Dec. 16, 2024.
Office Action issued for counterpart Chinese Application 202080047123.4, issued by The State Intellectual Property Office of People's Republic of China on Sep. 24, 2025.

* cited by examiner

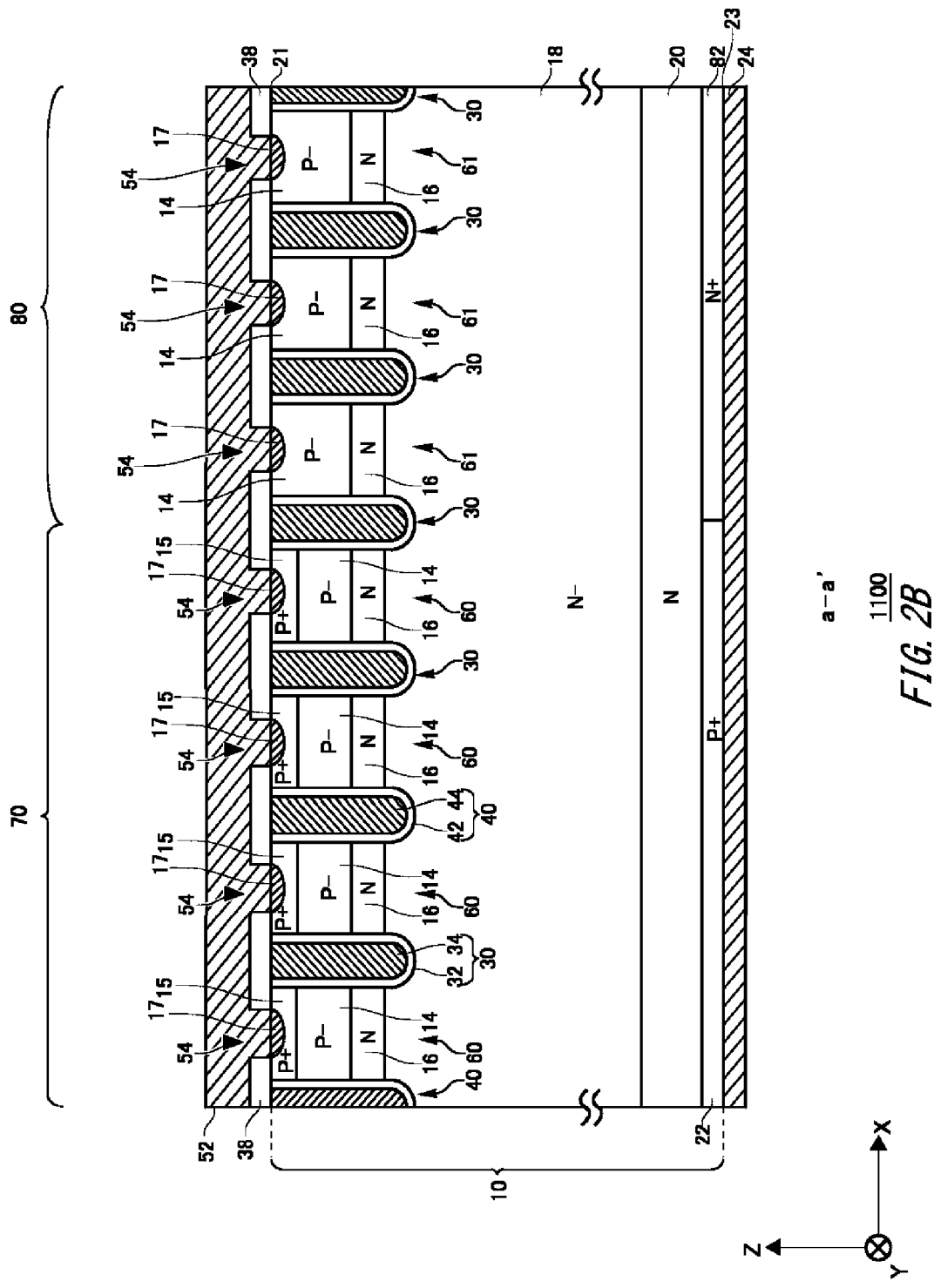

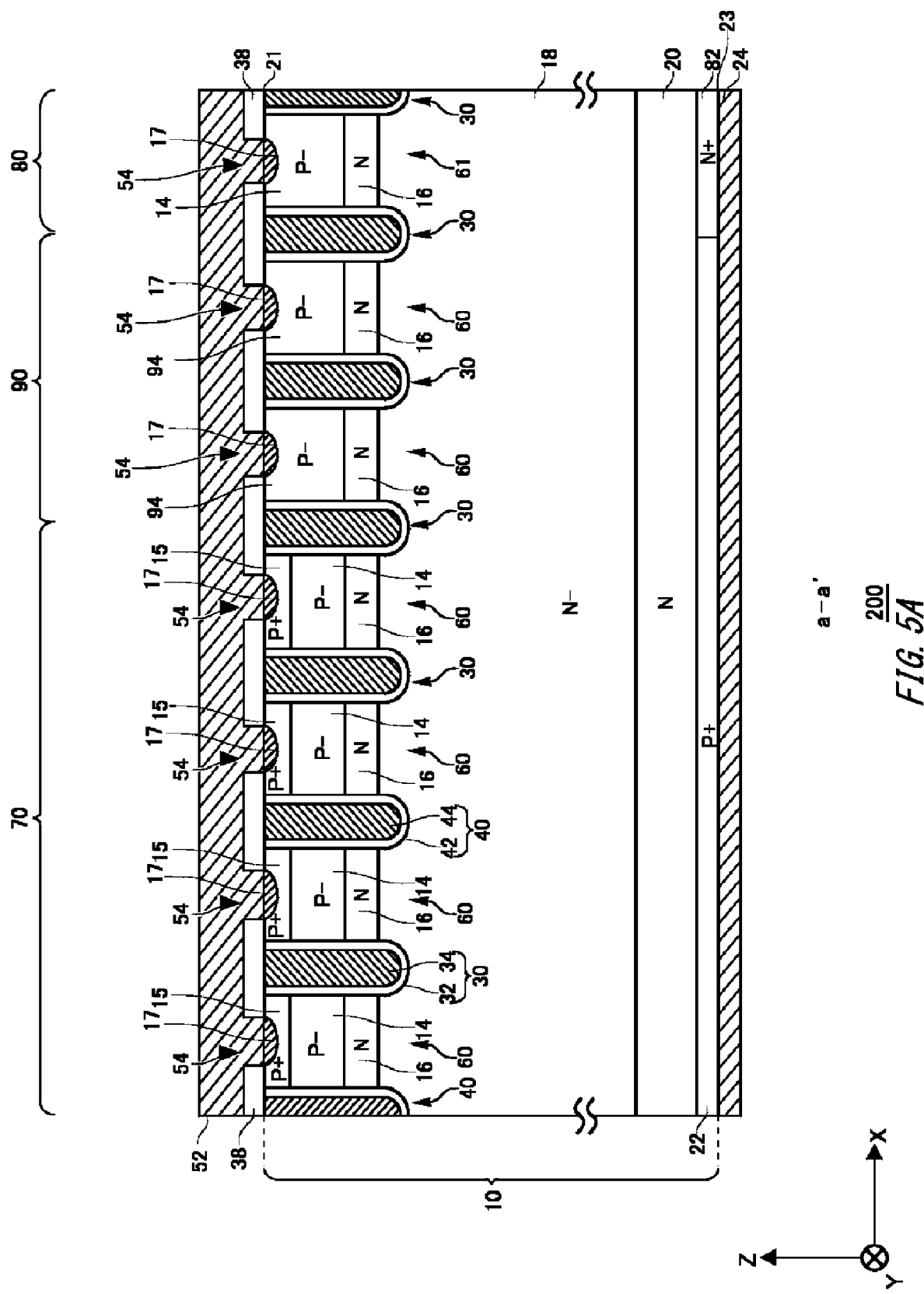

SEMICONDUCTOR DEVICE HAVING AN INJECTION SUPPRESSION REGION

The contents of the following Japanese patent application(s) are incorporated herein by reference:
NO. 2020-006095 filed in JP on Jan. 17, 2020
NO. 2020-085521 filed in JP on May 14, 2020
NO. PCT/JP2020/044532 filed in WO on Nov. 30, 2020

BACKGROUND

1. Technical Field

The present invention relates to a semiconductor device.

2. Related Art

Conventionally, in a semiconductor device in which a transistor portion such as an insulated gate bipolar transistor (IGBT) and a diode portion are formed in the same substrate, it is known that a contact layer having an impurity concentration higher than that of an anode layer of the diode portion is provided in the transistor portion (for example, Patent Literature 1).
Patent Literature 1: WO 2016/030966 A

BRIEF DESCRIPTION OF THE DRAWINGS

FIG. 2B is a diagram illustrating a cross section taken along line a-a' in FIG. 2A.

FIG. 5A is a partial sectional view of a semiconductor device 200 according to Example 2 of the present embodiment.

DESCRIPTION OF EXEMPLARY EMBODIMENTS

Figure 1A:
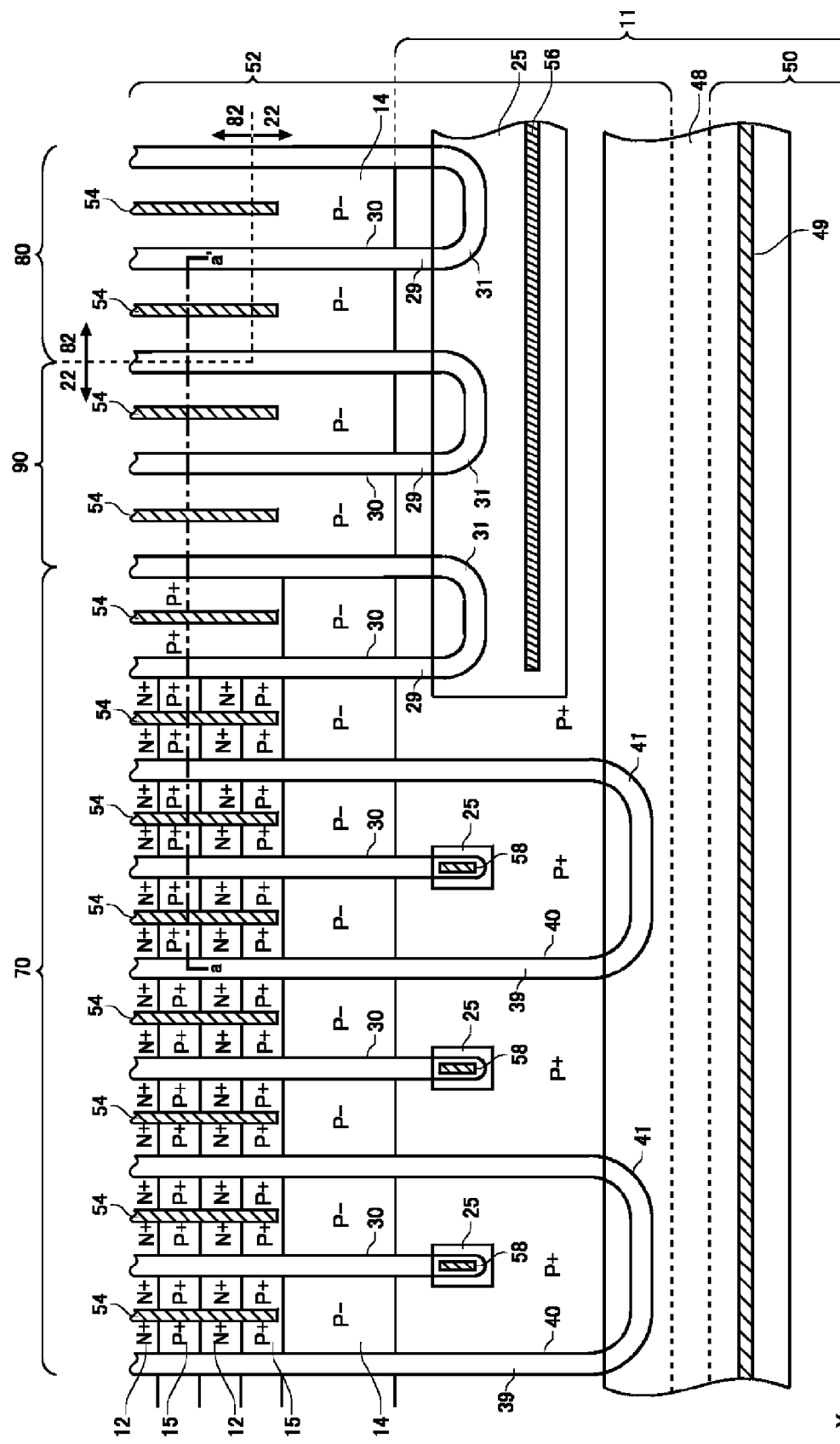
FIG. 1A is a partial top view of a semiconductor device 100 according to Example 1 of the present embodiment.

Hereinafter, the present invention will be described through embodiments of the invention, but the following embodiments do not limit the invention according to the claims. In addition, not all combinations of features described in the embodiments are essential to the solution of the invention.

In the present specification, one side in a direction parallel to the depth direction of the semiconductor substrate is referred to as "upper", and the other side is referred to as "lower". One of two main surfaces of a substrate, a layer, or another member is referred to as a front surface, and the other surface is referred to as a back surface. The "upper" and "lower" directions are not limited to the gravity direction or the direction at the time of mounting the semiconductor device.

In the present specification, technical matters may be described using orthogonal coordinate axes of an X axis, a Y axis, and a Z axis. The orthogonal coordinate axes merely identify relative positions of the components, and do not limit a specific direction. For example, the Z axis does not exclusively indicate the height direction with respect to the ground. The +Z axis direction and the −Z axis direction are opposite to each other. In a case where the positive and negative are not described and described as the Z axis direction, it means a direction parallel to the +Z axis and the −Z axis.

In the present specification, orthogonal axes parallel to the front surface and the back surface of the semiconductor substrate are defined as an X axis and a Y axis. An axis perpendicular to the front surface and the back surface of the semiconductor substrate is defined as a Z axis. In the present specification, the Z axis direction may be referred to as a depth direction. In addition, in the present specification, a direction parallel to the front surface and the back surface of the semiconductor substrate including the X axis and the Y axis may be referred to as a horizontal direction.

In the present specification, the term "same" or "equal" may include a case where there is an error due to manufacturing variation or the like. The error is, for example, within 10%.

In the present specification, the conductivity type of the doping region doped with impurities is described as a P type or N type. In the present specification, the impurity may particularly mean either an N type donor or a P type acceptor, and may be described as a dopant. In the present specification, doping means introducing a donor or an acceptor into a semiconductor substrate to form a semiconductor exhibiting a conductivity type of an N type or a semiconductor exhibiting a conductivity type of a P type.

In the present specification, the doping concentration means the concentration of donors or the concentration of the acceptors in the thermal equilibrium state. In the present specification, the net doping concentration means the net concentration obtained by adding the donor concentration as the concentration of positive ions and the acceptor concentration as the concentration of negative ions including the polarity of charges. As an example, if the donor concentration is $N_D$ and the acceptor concentration is $N_A$, the net doping concentration at an arbitrary position is $N_D-N_A$.

The donor has a function of supplying electrons to the semiconductor. The acceptor has a function of receiving electrons from the semiconductor. The donor and acceptor are not limited to the impurities themselves. For example, a VOH defect in which vacancies (V), oxygen (O), and hydrogen (H) are bonded in a semiconductor functions as a donor for supplying electrons.

In the present specification, when described as a P+ type or N+ type, it means that the doping concentration is higher than that of a P type or N type, and when described as a P− type or N− type, it means that the doping concentration is lower than that of the P type or N type. In addition, in the present specification, the description of the P++ type or N++ type means that the doping concentration is higher than that of the P+ type or N+ type.

In the present specification, the chemical concentration refers to the concentration of impurities measured regardless of the state of electrical activation. The chemical concentration can be measured by, for example, secondary ion mass spectrometry (SIMS). The above-described net doping concentration can be measured by a capacitance-voltage profiling (CV profiling). In addition, the carrier concentration measured by a spread resistance profiling method (SRP method) may be a net doping concentration. The carrier concentration measured by the CV profiling or the SRP method may be a value in a thermal equilibrium state. In addition, since the donor concentration is sufficiently larger than the acceptor concentration in the N type region, the carrier concentration in the region may be used as the donor concentration. Similarly, in the P type region, the carrier concentration in the region may be set as the acceptor concentration.

In addition, in a case where the concentration distribution of the donor, acceptor, or net doping has a peak, the peak value may be the concentration of donors, acceptors, or net doping in the region. In a case where the concentration of the donor, the acceptor, or the net doping is approximately uniform or the like, an average value of the concentration of the donor, the acceptor, or the net doping in the corresponding region may be used as the concentration of the donor, the acceptor, or the net doping.

The carrier concentration measured by the SRP method may be lower than the concentration of donors or acceptors. In a range where the current flows when measuring a spreading resistance, there is a case where the carrier mobility of the semiconductor substrate is lower than the value of the crystal state. The decrease in carrier mobility occurs due to disorder of the crystal structure caused by a lattice defect or the like to make the carrier scatter.

The concentration of donors or acceptors calculated from the carrier concentration measured by the CV profiling or the SRP method may be lower than the chemical concentration of elements indicating the donor or the acceptor. As an example, the donor concentration of phosphorus or arsenic as a donor, or the acceptor concentration of boron as an acceptor in a silicon semiconductor is about 99% of its chemical concentration. On the other hand, the donor concentration of hydrogen as a donor in the silicon semiconductor is about 0.1% to 10% of the chemical concentration of hydrogen.

Example 1

FIG. 1A is a partial top view of a semiconductor device 100 according to Example 1 of the present embodiment. The semiconductor device 100 includes a semiconductor substrate having a transistor portion 70 including a transistor device such as an IGBT and a diode portion 80 including a diode device such as a freewheeling diode (FWD).

Note that, in the present specification, when simply referred to as a top view, it means viewing from the front surface side of the semiconductor substrate. In the present example, an arrangement direction of the transistor portion 70 and the diode portion 80 in a top view is referred to as an X axis, a direction perpendicular to the X axis on the front surface of the semiconductor substrate is referred to as a Y axis, and a direction perpendicular to the front surface of the semiconductor substrate is referred to as a Z axis.

Each of the transistor portion 70 and the diode portion 80 may have a longitudinal length in the extending direction. That is, the length of the transistor portion 70 in the Y axis direction is larger than the width thereof in the X axis direction. Similarly, the length of the diode portion 80 in the Y axis direction is larger than the width thereof in the X axis direction. The extending direction of the transistor portion 70 and the diode portion 80 may be the same as the longitudinal direction of each trench portion to be described later.

The diode portion 80 has an N+ type cathode region in a region in contact with the back surface of the semiconductor substrate. In the present specification, a region where the cathode region is provided is referred to as a diode portion 80. That is, the diode portion 80 is a region overlapping the cathode region in a top view. On the other hand, the transistor portion 70 has a P+ type collector region in a region in contact with the back surface of the semiconductor substrate.

The semiconductor device 100 of the present example includes a gate trench portion 40, a dummy trench portion 30, a well region 11, an emitter region 12, a base region 14, and an extraction region 15 provided inside the front surface side of the semiconductor substrate. Each of the gate trench portion 40 and the dummy trench portion 30 is an example of a trench portion.

In addition, the semiconductor device 100 of the present example includes a gate metal layer 50 and an emitter electrode 52 provided above the front surface of the semiconductor substrate. The gate metal layer 50 and the emitter electrode 52 are provided separately from each other.

An interlayer dielectric film is provided between the emitter electrode 52 and the gate metal layer 50, and the front surface of the semiconductor substrate, but is omitted in FIG. 1A. In the interlayer dielectric film of the present example, contact holes 49, 54, 56, and 58 are provided through the interlayer dielectric film. In FIG. 1A, each contact hole is hatched with oblique lines.

The emitter electrode 52 is provided above the gate trench portion 40, the dummy trench portion 30, the well region 11, the emitter region 12, the base region 14, and the extraction region 15. The emitter electrode 52 is in contact with the emitter region 12, the base region 14, and the extraction region 15 in the front surface of the semiconductor substrate through the contact hole 54.

The emitter electrode 52 is connected to a dummy conductive portion in the dummy trench portion 30 through the contact hole 56 or the contact hole 58. A connection portion 25 formed of a material having conductivity such as polysilicon doped with impurities may be provided between the emitter electrode 52 and the dummy conductive portion. Each of the connection portions 25 is provided on the front surface of the semiconductor substrate via an insulating film.

The gate metal layer 50 is in contact with a gate runner 48 through the contact hole 49. The gate runner 48 may be formed of polysilicon doped with impurities or the like. The gate runner 48 is connected to the gate conductive portion in the gate trench portion 40 on the front surface of the semiconductor substrate. The gate runner 48 is not electrically connected to the dummy conductive portion in the dummy trench portion 30 and the emitter electrode 52.

The gate runner 48 and the emitter electrode 52 may be electrically separated from each other by an insulator such as an interlayer dielectric film and an oxide film. The gate runner 48 of the present example is provided from below the contact hole 49 to the edge portion of the gate trench portion 40. At the edge portion of the gate trench portion 40, the gate conductive portion is exposed on the front surface of the semiconductor substrate and is in contact with the gate runner 48.

The emitter electrode 52 and the gate metal layer 50 are formed of a conductive material containing metal. For example, it is formed of polysilicon, aluminum, or an aluminum-silicon alloy. Each electrode may have a barrier metal formed of titanium, a titanium compound, or the like in a lower layer of a region formed of aluminum or the like.

Each electrode may have a plug formed of tungsten or the like in the contact hole. The plug may have a barrier metal on the side in contact with the semiconductor substrate, may be embedded with tungsten so as to be in contact with the barrier metal, and may be formed of aluminum or the like on the tungsten.

Note that the plug is provided in a contact hole in contact with the extraction region 15 or the base region 14. In addition, a P++ type plug region 17 having a higher doping concentration than the extraction region 15 is formed below the contact hole of the plug. This can improve the contact resistance between the barrier metal and the extraction region 15. In addition, the depth of the plug region 17 is about 0.1 μm or less, and has a region as small as 10% or less as the depth of the extraction region 15.

The plug region 17 has the following characteristics. In the operation of the transistor portion 70, a latch-up withstand capability is improved by improving the contact resistance. On the other hand, in the operation of the diode portion 80, in a case where there is no plug region, the contact resistance between the barrier metal and the base region 14 is high, and the conduction loss and the switching loss increase. However, by providing the plug region 17, the conduction loss and the switching loss can be suppressed from increasing.

The well region 11 is provided to overlap with the gate runner 48. The well region 11 is also provided to extend with a predetermined width in a range not overlapping with the gate runner 48. The well region 11 of the present example is provided away from the end of the contact hole 54 in the Y axis direction toward the gate runner 48 side. The well region 11 is a region of a second conductivity type having a higher doping concentration than the base region 14.

The base region 14 in the present example is a P− type, and the well region 11 is a P+ type. In addition, the well region 11 is formed from the front surface of the semiconductor substrate to a position deeper than the lower end of the base region 14.

Each of the transistor portion 70 and the diode portion 80 has a plurality of trench portions arranged in the arrangement direction. In the transistor portion 70 of the present example, one or more gate trench portions 40 and one or more dummy trench portions 30 are alternately provided along the arrangement direction. In the diode portion 80 of the present example, a plurality of dummy trench portions 30 are provided along the arrangement direction. The diode portion 80 of the present example is not provided with the gate trench portion 40.

The gate trench portion 40 of the present example may have two straight portions 39 (portions of the trenches which are straight along the extending direction) extending along the extending direction perpendicular to the arrangement direction and the edge portion 41 connecting the two straight portions 39.

At least a part of the edge portion 41 may be provided in a curved shape in a top view. The end portions of the two straight portions 39 in the Y axis direction are connected to the gate runner 48 at the edge portion 41, so that the edge portion functions as a gate metal layer to the gate trench portion 40. On the other hand, by forming the edge portion 41 in a curved shape, it is possible to reduce the electric field strength at the time of gate bias at the end portion rather than being completed by the straight portion 39.

In the transistor portion 70, the dummy trench portion 30 is provided between the straight portions 39 of the gate trench portion 40. One dummy trench portion 30 may be provided between the straight portions 39, and a plurality of dummy trench portions 30 may be provided.

One dummy trench portion 30 may not be provided between the straight portions 39, and the gate trench portion 40 may be provided. With such a structure, since the electron current from the emitter region 12 can be increased, the ON voltage is reduced.

The dummy trench portion 30 may have a linear shape extending in the extending direction, and may have a straight portion 29 and an edge portion 31 similar to the gate trench portion 40. The semiconductor device 100 illustrated in FIG. 1A includes both the linear dummy trench portion 30 not having the edge portion 31 and the dummy trench portion 30 having the edge portion 31.

The diffusion depth of the well region 11 may be deeper than the depths of the gate trench portion 40 and the dummy trench portion 30. The end portions of the gate trench portion 40 and the dummy trench portion 30 in the Y axis direction are provided in the well region 11 in a top view. That is, the bottom portion of each trench portion in the depth direction is covered with the well region 11 at the end portion of each trench portion in the Y axis direction. As a result, electric field strength at the bottom portion of each trench portion can be reduced.

A mesa portion is provided between the trench portions in the arrangement direction. The mesa portion refers to a region sandwiched between the trench portions inside the semiconductor substrate. As an example, the depth position of the mesa portion is from the front surface of the semiconductor substrate to the lower end of the trench portion.

The mesa portion of the present example is sandwiched between adjacent trench portions in the X axis direction, and is provided to extend in the extending direction (Y axis direction) along the trench in the front surface of the semiconductor substrate. As described later with FIG. 1B, in the present example, the transistor portion 70 is provided with a mesa portion 60, and the diode portion 80 is provided with a mesa portion 61. In the case of simply referring to as a mesa portion in the present specification, the mesa portion refers to each of the mesa portion 60 and the mesa portion 61.

The base region 14 is provided in each mesa portion. In each mesa portion of the transistor portion 70, at least one of the emitter region 12 of the first conductivity type and the extraction region 15 of the second conductivity type may be provided in a region sandwiched between the base regions 14 in a top view. The emitter region 12 in the present example is an N+ type, and the extraction region 15 is a P+ type. The emitter region 12 and the extraction region 15 may be provided between the base region 14 and the front surface of the semiconductor substrate 10 in the depth direction.

The mesa portion of the transistor portion 70 has the emitter region 12 exposed to the front surface of the semiconductor substrate. The emitter region 12 is provided in contact with the gate trench portion 40. The mesa portion in contact with the gate trench portion 40 may be provided with the extraction region 15 exposed to the front surface of the semiconductor substrate.

Each of the extraction region 15 and the emitter region 12 in the mesa portion 60 is provided from one trench portion to the other trench portion in the X axis direction. As an example, the extraction region 15 and the emitter region 12 of the mesa portion are alternately disposed along the extending direction (Y axis direction) of the trench portion.

In another example, the extraction region 15 and the emitter region 12 of the mesa portion 60 may be provided in a stripe shape along the extending direction (Y axis direction) of the trench portion. For example, the emitter region 12 is provided in a region in contact with the trench portion, and the extraction region 15 is provided in a region sandwiched by the emitter region 12.

However, in the transistor portion 70, the emitter region 12 is not provided in the mesa portion adjacent to an injection suppression region 90 to be described later, and the extraction region 15 exposed to the front surface of the semiconductor substrate is provided. The extraction region 15 may be provided in contact with the dummy trench portion 30 in a region sandwiched between the base regions 14 in a top view.

The emitter region 12 is not provided in the mesa portion of the diode portion 80. The base region 14 may be provided on the upper surface of the mesa portion of the diode portion 80. The base region 14 may be disposed in the entire mesa portion of the diode portion 80.

The contact hole 54 is provided above each mesa portion. The contact hole 54 is disposed in a region sandwiched between the base regions 14 in the extending direction (Y axis direction). The contact hole 54 of the present example is provided above each region of the extraction region 15, the base region 14, and the emitter region 12. The contact hole 54 may be disposed at the center in the arrangement direction (X axis direction) of the mesa portion.

In the diode portion 80, an N+ type cathode region 82 is provided in a region adjacent to the back surface of the semiconductor substrate. In the back surface of the semiconductor substrate, a P+ type collector region 22 may be provided in a region where the cathode region 82 is not provided. In FIG. 1A, the boundary between the cathode region 82 and the collector region 22 is indicated by a dotted line.

The cathode region 82 is disposed away from the well region 11 in the Y axis direction. As a result, by securing a distance between the cathode region 82 and the P-type region (well region 11) having a relatively high doping concentration and formed up to a deep position, hole injection from the well region 11 can be suppressed, so that the reverse recovery loss can be reduced. The end portion of the cathode region 82 in the Y axis direction of the present example is disposed farther from the well region 11 than the end portion of the contact hole 54 in the Y axis direction. In another example, the end portion of the cathode region 82 in the Y axis direction may be disposed between the well region 11 and the contact hole 54.

The transistor portion 70 has an injection suppression region 90 that suppresses injection of the second conductivity type carrier at an end portion on the diode portion 80 side in a top view of the semiconductor substrate.

In the injection suppression region 90, a P+ type collector region 22 is provided on the back surface of the semiconductor substrate. That is, although the injection suppression region 90 is a part of the transistor portion 70, in the present specification, the transistor portion 70 and the injection suppression region 90 will be basically described separately.

In the upper surface of the injection suppression region 90, unlike the transistor portion 70, the emitter region 12 and the extraction region 15 are not provided, and the base region 14 is provided. In addition, unlike the transistor portion 70, the injection suppression region 90 does not have the gate trench portion 40 but has the dummy trench portion 30.

In FIG. 1A, the injection suppression region 90 is illustrated as two mesa portions adjacent to each other from the dummy trench portion 30, but the present invention is not limited thereto. The injection suppression region 90 may have more than two mesa portions.

Figure 1B:
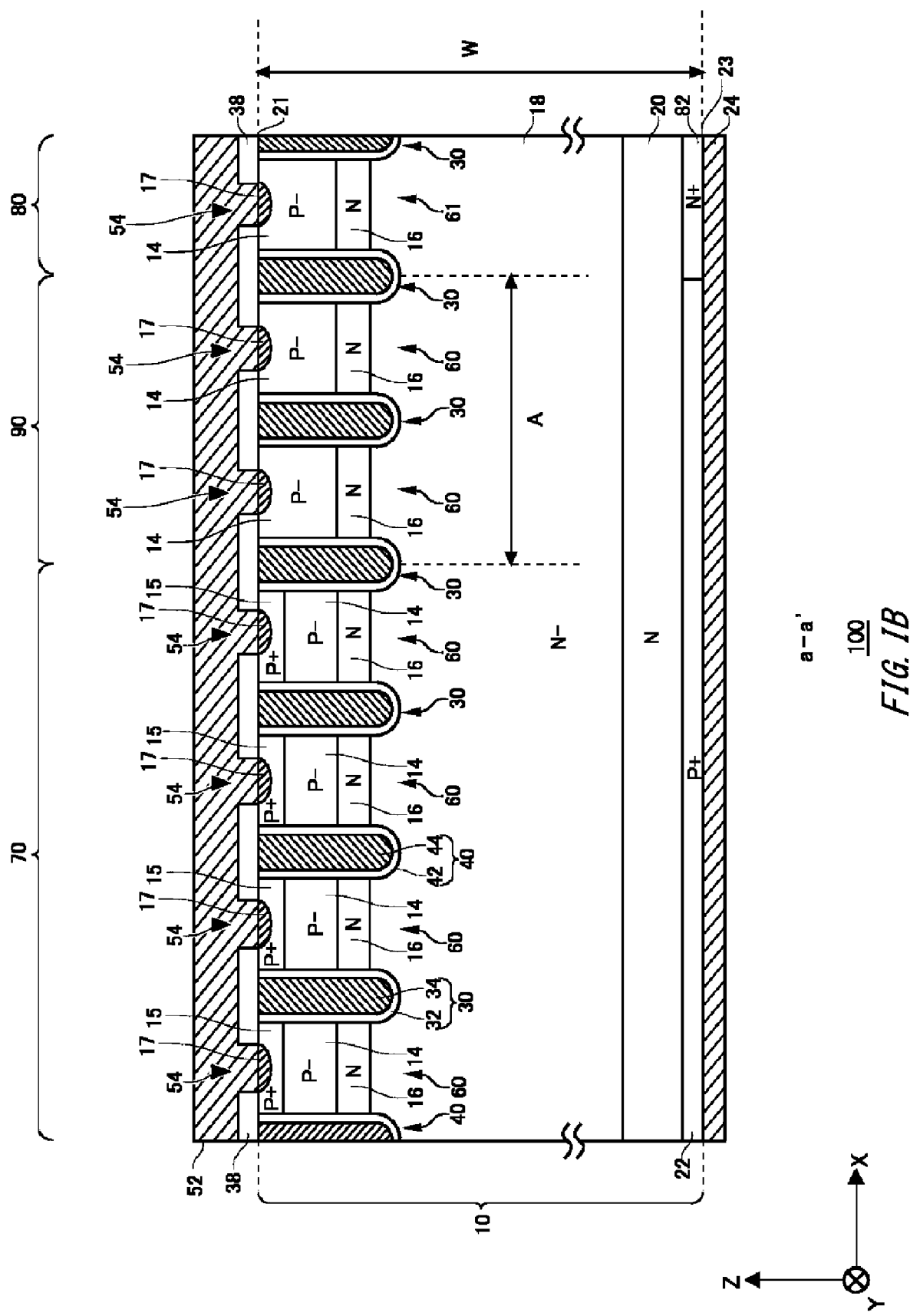
FIG. 1B is a diagram illustrating a cross section taken along line a-a' in FIG. 1A.

FIG. 1B is a diagram illustrating a cross section taken along line a-a' in FIG. 1A. The a-a' cross section is an XZ plane passing through the emitter region 12, the base region 14, the gate trench portion 40, and the dummy trench portion 30. The semiconductor device 100 of the present example includes the substrate 10, the interlayer dielectric film 38, the emitter electrode 52, and a collector electrode 24 in the a-a' cross section.

The interlayer dielectric film 38 is provided in a front surface 21 of the substrate 10. The interlayer dielectric film 38 is an insulating film such as silicate glass to which an impurity such as boron or phosphorus is added. The interlayer dielectric film 38 may be in contact with the front surface 21, and another film such as an oxide film may be provided between the interlayer dielectric film 38 and the front surface 21. The interlayer dielectric film 38 is provided with the contact hole 54 described in FIG. 1A.

The emitter electrode 52 is provided in the front surface 21 of the substrate 10 and the upper surface of the interlayer dielectric film 38. The emitter electrode 52 passes through the contact hole 54 of the interlayer dielectric film 38 and is in electrical contact with the front surface 21. A contact plug such as tungsten (W) may be provided inside the contact hole 54. The collector electrode 24 is provided in a back surface 23 of the substrate 10. The emitter electrode 52 and the collector electrode 24 are formed of a material containing metal.

The substrate 10 may be a silicon substrate, a silicon carbide substrate, a nitride semiconductor substrate such as gallium nitride, or the like. The substrate 10 of the present example is a silicon substrate.

The substrate 10 has a drift region 18 of the first conductivity type. The drift region 18 of the present example is an N− type. The drift region 18 may be a region remaining without other doping regions provided in the substrate 10.

Above the drift region 18, one or more accumulation regions 16 may be provided in the Z axis direction. The accumulation region 16 is a region in which the same dopant as the drift region 18 is accumulated at a higher concentration than the drift region 18. The doping concentration of the accumulation region 16 is higher than the doping concentration of the drift region 18. By providing the accumulation region 16, the injection-enhancement effect (IE effect) of the carrier can be enhanced, and the ON voltage can be reduced.

In the transistor portion 70, the emitter region 12 is provided above the base region 14 in contact with the front surface 21. The emitter region 12 is provided in contact with the gate trench portion 40. The doping concentration of the emitter region 12 is higher than the doping concentration of the drift region 18. The dopant of the emitter region 12 is, for example, arsenic (As), phosphorus (P), antimony (Sb), or the like.

The width A of the injection suppression region 90 in the arrangement direction (X axis direction in FIG. 1B) ranges from 20 μm to 900 μm. In addition, the following Expression (1) is established between the width A of the injection suppression region 90 and the substrate thickness W of the semiconductor device 100.

$$A \leq 6W \quad \text{[Expression (1)]}$$

The substrate thickness W indicates a thickness from the upper surface of the base region 14 of the diode portion 80 to the lower surface of the cathode region 82. As the substrate thickness W increases, the diffusion region of electrons of the cathode region 82 of the diode portion 80 increases, and thus, it is found that the reverse recovery and the turn-on loss are reduced by Expression (1).

In addition, in the transistor portion 70, in the mesa portion 60 on the injection suppression region 90 side, the extraction region 15 is provided in contact with the front surface 21 above the base region 14. The extraction region 15 may be provided in contact with the dummy trench portion 30.

The base region 14 exposed to the front surface 21 is provided in the diode portion 80 and the injection suppression region 90. The base region 14 of the diode portion 80 operates as an anode.

A buffer region 20 of the first conductivity type may be provided below the drift region 18. The buffer region 20 of the present example is an N type. The doping concentration of the buffer region 20 is higher than the doping concentration of the drift region 18. The buffer region 20 may function as a field stop layer that prevents a depletion layer extending from the lower surface side of the base region 14 from reaching the collector region 22 and the cathode region 82.

In the transistor portion 70 and the injection suppression region 90, the collector region 22 is provided below the buffer region 20. The collector region 22 of the injection suppression region 90 may be provided in contact with the cathode region 82 in the back surface 23.

In the diode portion 80, the cathode region 82 is provided below the buffer region 20. The cathode region 82 may be provided at the same depth as the transistor portion 70 and the collector region 22 of the injection suppression region 90. The diode portion 80 may function as a freewheeling diode (FWD) that allows a freewheeling current that conducts in the reverse direction to flow when the transistor portion 70 is turned off.

The substrate 10 is provided with the gate trench portion 40 and the dummy trench portion 30. The gate trench portion 40 and the dummy trench portion 30 are provided so as to penetrate the base region 14 and the accumulation region 16 from the front surface 21 and reach the drift region 18. The trench portion penetrating the doping region is not limited to those manufactured in the order of forming the doping region and then forming the trench portion. A case where a doping region is formed between the trench portions after the trench portion is formed is also included in a case where the trench portion penetrates the doping region.

The gate trench portion 40 includes a gate trench, a gate insulating film 42, and a gate conductive portion 44 provided in the front surface 21. The gate insulating film 42 is provided to cover the inner wall of the gate trench. The gate insulating film 42 may be formed by oxidizing or nitriding the semiconductor of the inner wall of the gate trench. The gate conductive portion 44 is provided on the inner side of the gate insulating film 42 inside the gate trench. The upper surface of the gate conductive portion 44 may be in the same XY plane as the front surface 21. The gate insulating film 42 insulates the gate conductive portion 44 from the substrate 10. The gate conductive portion 44 is formed of a semiconductor such as polysilicon doped with impurities.

The gate conductive portion 44 may be provided longer than the base region 14 in the depth direction. The gate trench portion 40 is covered with the interlayer dielectric film 38 on the front surface 21. If a predetermined voltage is applied to the gate conductive portion 44, a channel by an inversion layer of electrons is formed in a surface layer of the interface in contact with the gate trench in the base region 14.

The dummy trench portion 30 may have the same structure as the gate trench portion 40 in the XZ cross section. The dummy trench portion 30 includes a dummy trench provided in the front surface 21, a dummy insulating film 32, and a dummy conductive portion 34. The dummy insulating film 32 is provided to cover the inner wall of the dummy trench. The dummy insulating film 32 may be formed by oxidizing or nitriding the semiconductor of the inner wall of the dummy trench. The dummy conductive portion 34 is provided on the inner side of the dummy insulating film 32 inside the dummy trench. The upper surface of the dummy conductive portion 34 may be in the same XY plane as the front surface 21. The dummy insulating film 32 insulates the dummy conductive portion 34 from the semiconductor substrate 10. The dummy conductive portion 34 may be formed of the same material as the gate conductive portion 44.

The gate trench portion 40 and the dummy trench portion 30 of the present example are covered with the interlayer dielectric film 38 in the front surface 21. Note that the bottom portions of the dummy trench portion 30 and the gate trench portion 40 may have a curved surface shape protruding downward (a curved shape in a cross section).

Figure 1C:
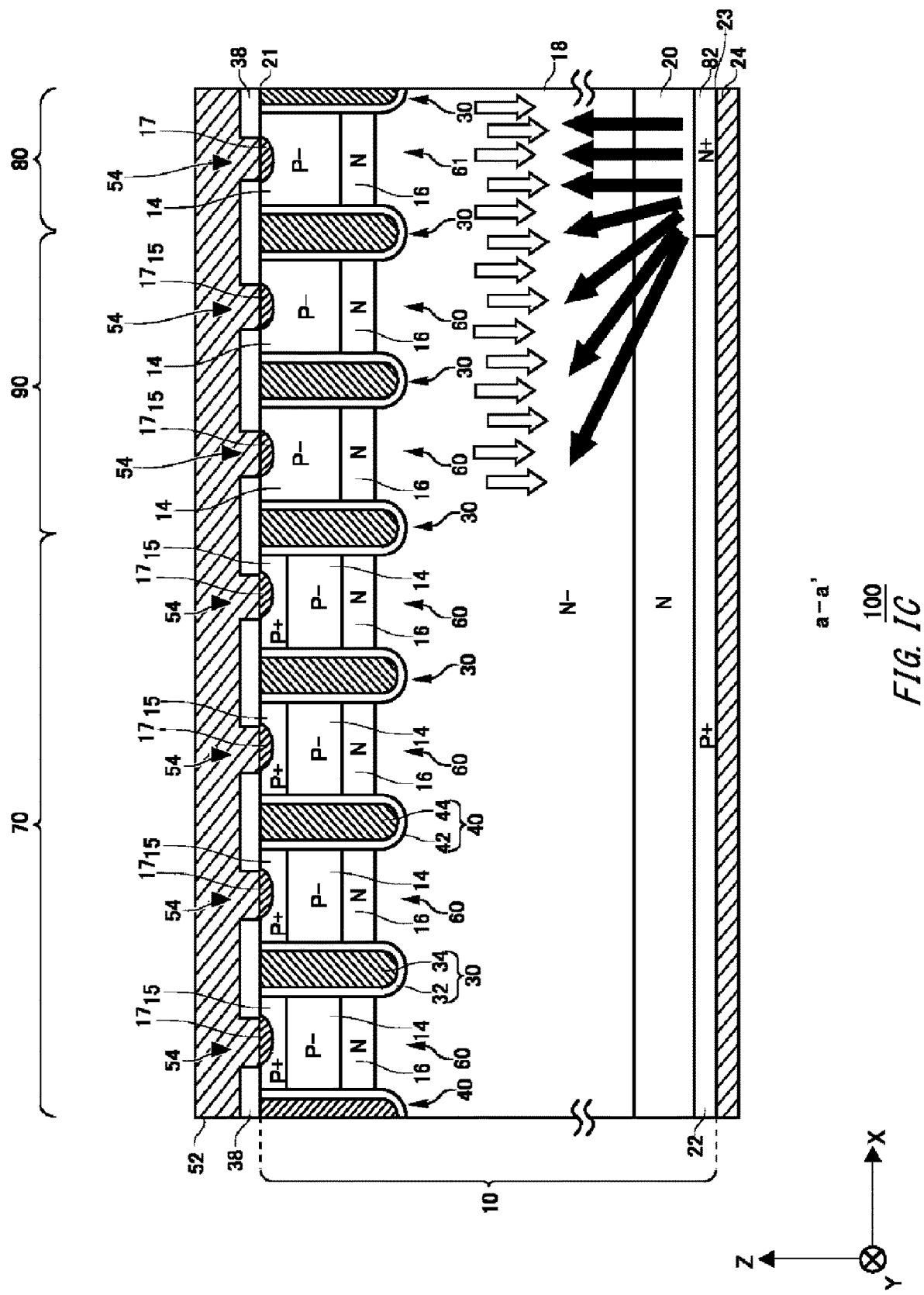
FIG. 1C is a diagram for explaining an operation of a diode portion 80 of the semiconductor device 100 during conduction.

FIG. 1C is a diagram for explaining an operation of the diode portion 80 of the semiconductor device 100 during conduction. FIG. 1C, like FIG. 2B, illustrates the a-a' cross section of FIG. 1A. In FIG. 1C, a black arrow indicates an electron current, and a white arrow indicates a hole current.

When the diode portion 80 conducts, the electron current flows from the cathode region 82 to the base region 14 operating as the anode layer. When the electron current reaches the base region 14, conductivity modulation occurs, and the hole current flows from the anode layer. However, since the base region 14 is also provided in the transistor portion 70, the electron current diffused from the cathode region 82 to the base regions 14 of the transistor portion 70 and the injection suppression region 90 is generated.

The electron current diffused toward the transistor portion 70 promotes hole injection from the base region 14 and the extraction region 15 of the transistor portion 70. Since the boron concentration in the extraction region 15 is 100 times higher than that in the base region 14, the hole density of the substrate 10 becomes high. As a result, it takes time until holes disappear when the diode portion 80 is turned off, so that the reverse recovery peak current increases and the reverse recovery loss increases.

As a technique for suppressing the hole current, a technique for providing a lifetime control region including a lifetime killer is known. The lifetime control region is formed to promote recombination and disappearance between electrons and holes generated at the time of conduction of the diode portion and reduce a reverse recovery loss. The lifetime killer is, for example, an electron beam injected into the entire semiconductor substrate, helium injected into a predetermined depth, an electron beam, a proton, or the like, and the lifetime control region is a crystal defect formed inside the semiconductor substrate by the lifetime killer injection.

When the lifetime killer is injected, the reverse recovery characteristics of the diode portion 80 are improved, but the ON voltage of the transistor portion 70 is deteriorated. Therefore, there is a method of injecting the lifetime killer only to the diode portion 80, but the lifetime killer protrudes toward the transistor portion 70 side in order to suppress hole injection from the extraction region 15.

However, when the lifetime killer is injected to the transistor portion 70 side, damage is accumulated in the gate oxide film, and there is a problem such as a threshold voltage drop. Therefore, it is more suitable for the operation of the semiconductor device 100 not to provide the lifetime control region in the transistor portion 70.

In the present example, the lifetime control region is not provided inside the substrate 10. Instead, the semiconductor device 100 of the present example includes the injection suppression region 90 provided between the transistor portion 70 and the diode portion 80.

In addition to the base region 14, the transistor portion 70 includes an extraction region 15 having a doping concentration higher than that of the base region 14 in order to prevent latch-up. However, since the transistor portion 70 has the injection suppression region 90 on the diode portion 80 side, the distance between the cathode region 82 and the base region 14 and the extraction region 15 of the transistor portion 70 becomes long. As a result, when the diode portion 80 is conductive, the electron current from the cathode region 82 flows into the base region 14 of the injection suppression region 90, and is suppressed from flowing into the transistor portion 70. As a result, the hole current from the extraction region 15 of the transistor portion 70 decreases, so that the reverse recovery loss is improved.

Next, the effects of the semiconductor device 1100 will be described by comparison with the semiconductor device 100 according to the comparative example.

Figure 2A:
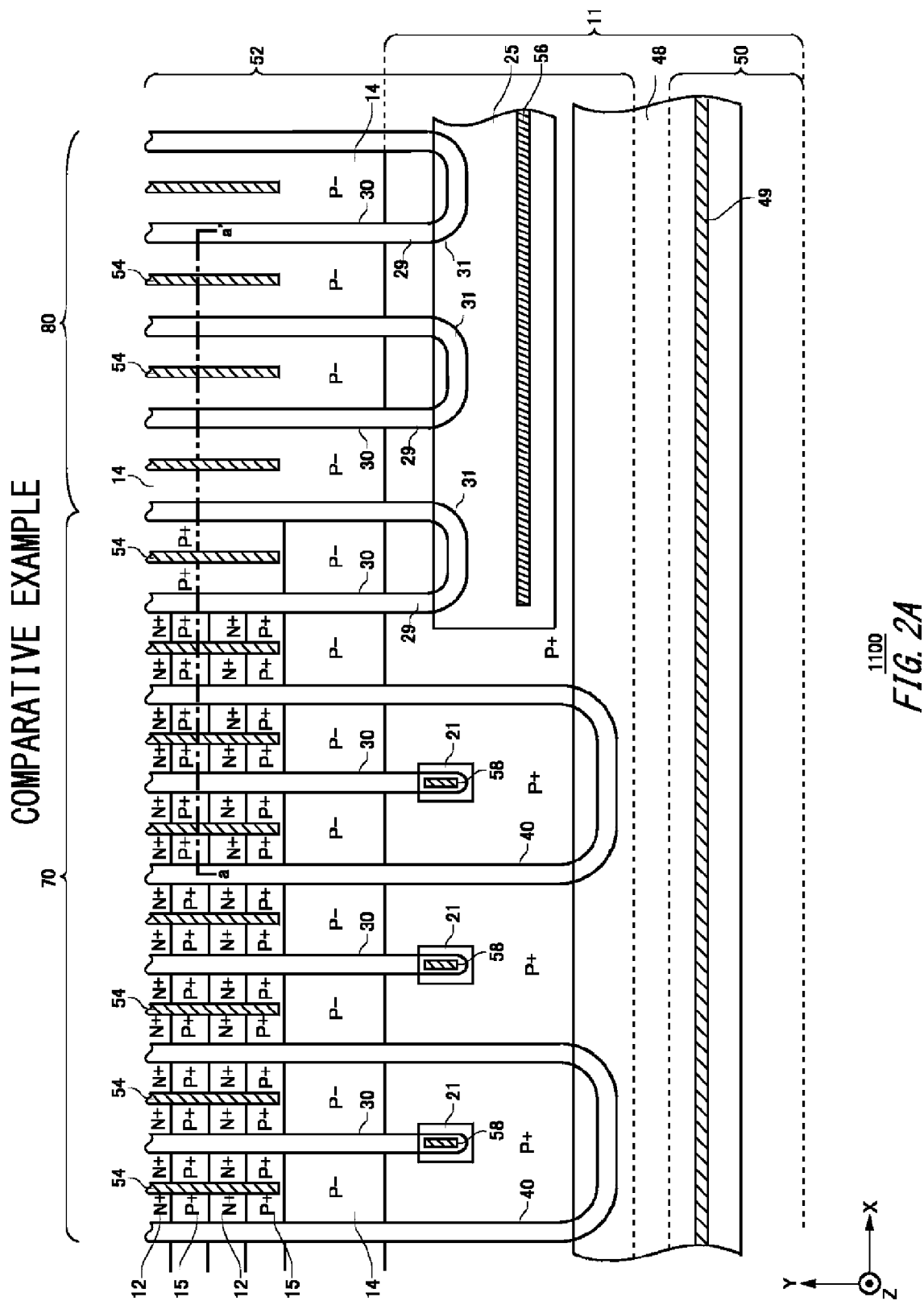
FIG. 2A is a diagram illustrating an example of a front surface of a semiconductor device 1100 according to a comparative example.

FIG. 2A is a diagram illustrating an example of a front surface of a semiconductor device 1100 according to a comparative example. FIG. 2B is a diagram illustrating a cross section taken along line a-a' in FIG. 2A. Here, elements common to the semiconductor device 100 are denoted by the same reference numerals, and description thereof is omitted.

The semiconductor device 1100 includes the transistor portion 70 and the diode portion 80. The mesa portion 60 of the transistor portion 70 has the emitter region 12 and the extraction region 15 exposed to the front surface 21 of the substrate 10. In the transistor portion 70, the emitter region 12 is not provided in the mesa portion 60 adjacent to the diode portion 80, and the extraction region 15 is provided.

The semiconductor device 100 and the semiconductor device 1100 are common in that the lifetime control region is not provided. However, the semiconductor device 1100 is different from the semiconductor device 100 in that the injection suppression region 90 is not provided in the semiconductor device 1100.

Figure 2C:
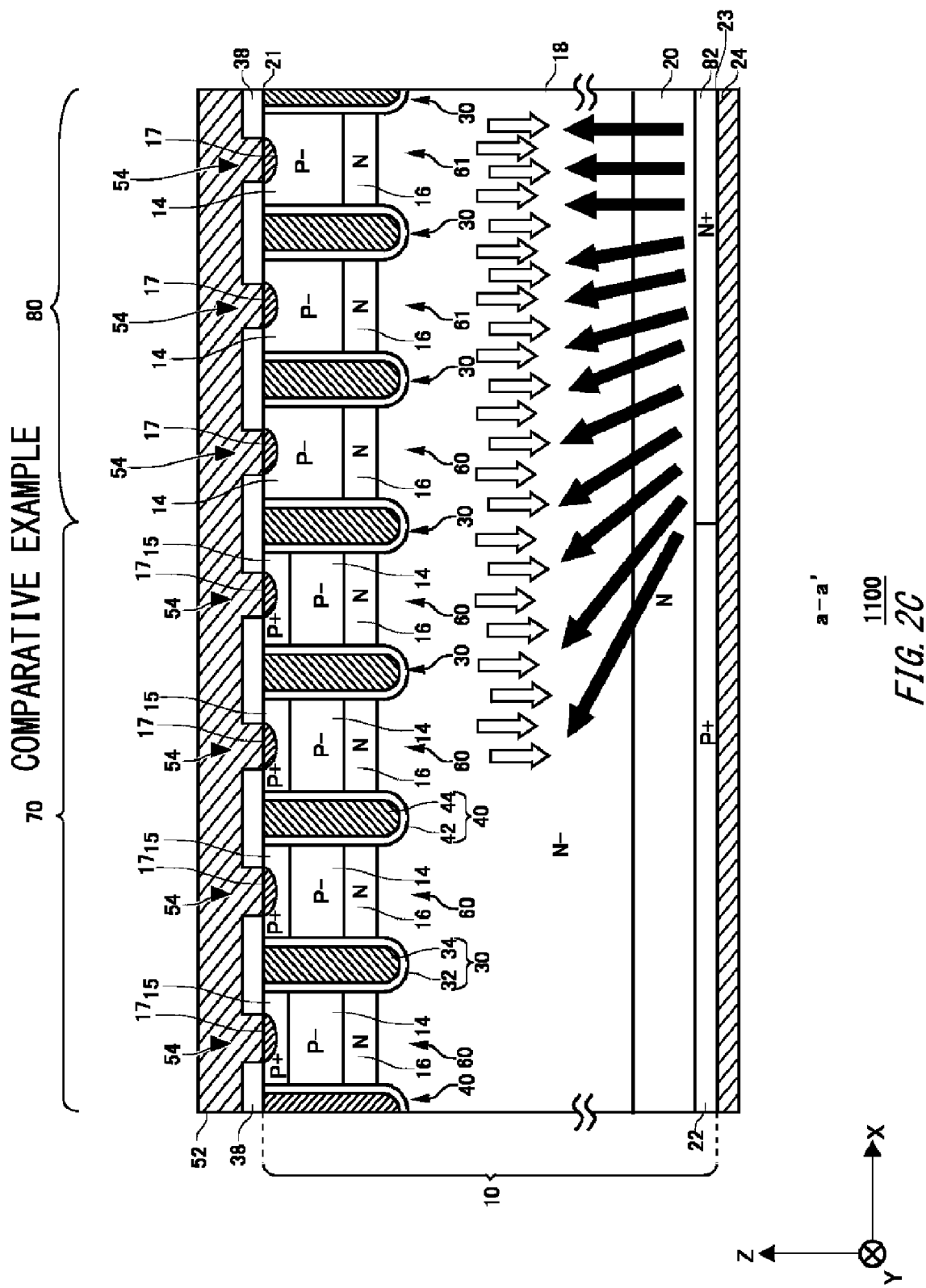
FIG. 2C is a diagram for explaining an operation of the diode portion 80 of the semiconductor device 1100 during conduction.

FIG. 2C is a diagram for explaining the operation of the diode portion 80 of the semiconductor device 1100 during conduction. FIG. 2C illustrates the a-a' cross section of FIG. 2A, similar to FIG. 2B. Here, the same elements as those of the semiconductor device 100 are denoted by the same reference numerals, and description thereof is omitted.

In the semiconductor device 1100, the cathode region 82 is provided adjacent to the transistor portion 70. Therefore, in the semiconductor device 1100, the distance between the cathode region 82 of the diode portion 80 and the base region 14 and the extraction region 15 of the transistor portion 70 is shorter than that in the semiconductor device 100.

Therefore, at the time of conduction of the diode portion 80, the electron current diffused from the cathode region 82 flows into the base region 14 and the extraction region 15 of the transistor portion 70 to promote hole injection.

Further, in the transistor portion 70 of the semiconductor device 1100, the extraction region 15 having a higher doping concentration than the base region 14 is provided adjacent to the diode portion 80. Therefore, in the semiconductor device 1100, more holes are injected into the substrate 10 from the extraction region 15.

When the hole density increases, it takes time for the holes to disappear after the diode portion 80 is turned off. Therefore, in the semiconductor device 1100, the reverse recovery current becomes large and the reverse recovery loss and the turn-on loss become large as compared with the semiconductor device 100.

On the other hand, in the semiconductor device 100, by providing the injection suppression region 90 not having the extraction region 15 on the diode portion 80 side, the distance between the cathode region 82 and the transistor portion 70 becomes long, so that hole injection is suppressed. As a result, the reverse recovery current can be reduced, and the reverse recovery loss and the turn-on loss can be reduced.

Figure 3A:
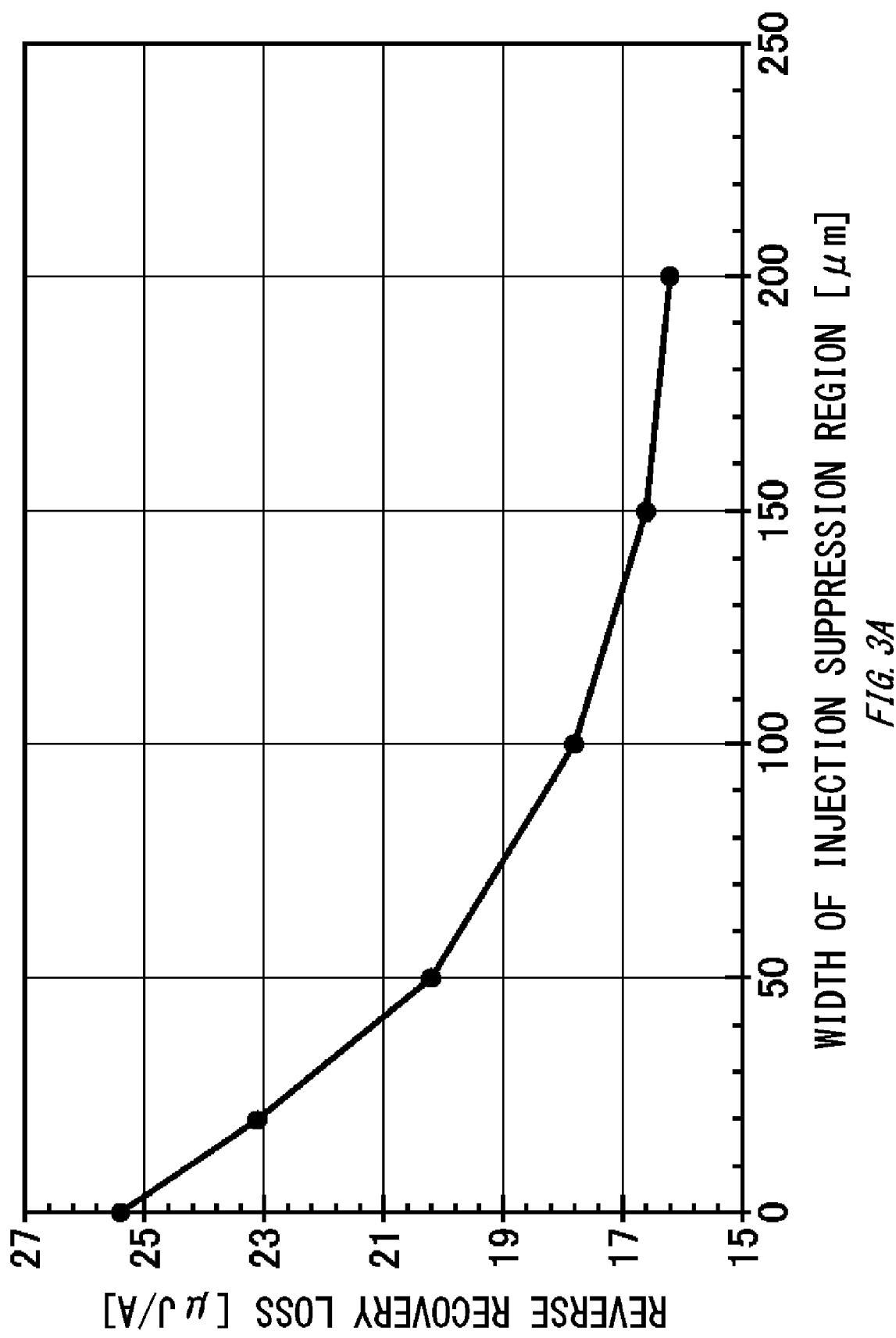
FIG. 3A is a graph illustrating a relationship between a width of an injection suppression region 90 and a reverse recovery loss.

FIG. 3A is a graph illustrating a relationship between the width of the injection suppression region 90 and the reverse recovery loss. Here, the width of the injection suppression region 90 refers to the distance between the end portion of the transistor portion 70 and the end portion of the diode portion 80 in the arrangement direction (X axis direction in FIGS. 1A to 2C).

A case where the width of the injection suppression region 90 is 0 corresponds to the semiconductor device 1100 according to the comparative example in which the injection suppression region 90 is not provided and the transistor portion 70 and the diode portion 80 are adjacent.

As illustrated in the graph of FIG. 3A, the reverse recovery loss decreases as the width of the injection suppression region 90 increases, and when the width of the injection suppression region 90 increases from 0 to 200 μm, the reverse recovery loss decreases by about 36.5%.

Figure 3B:
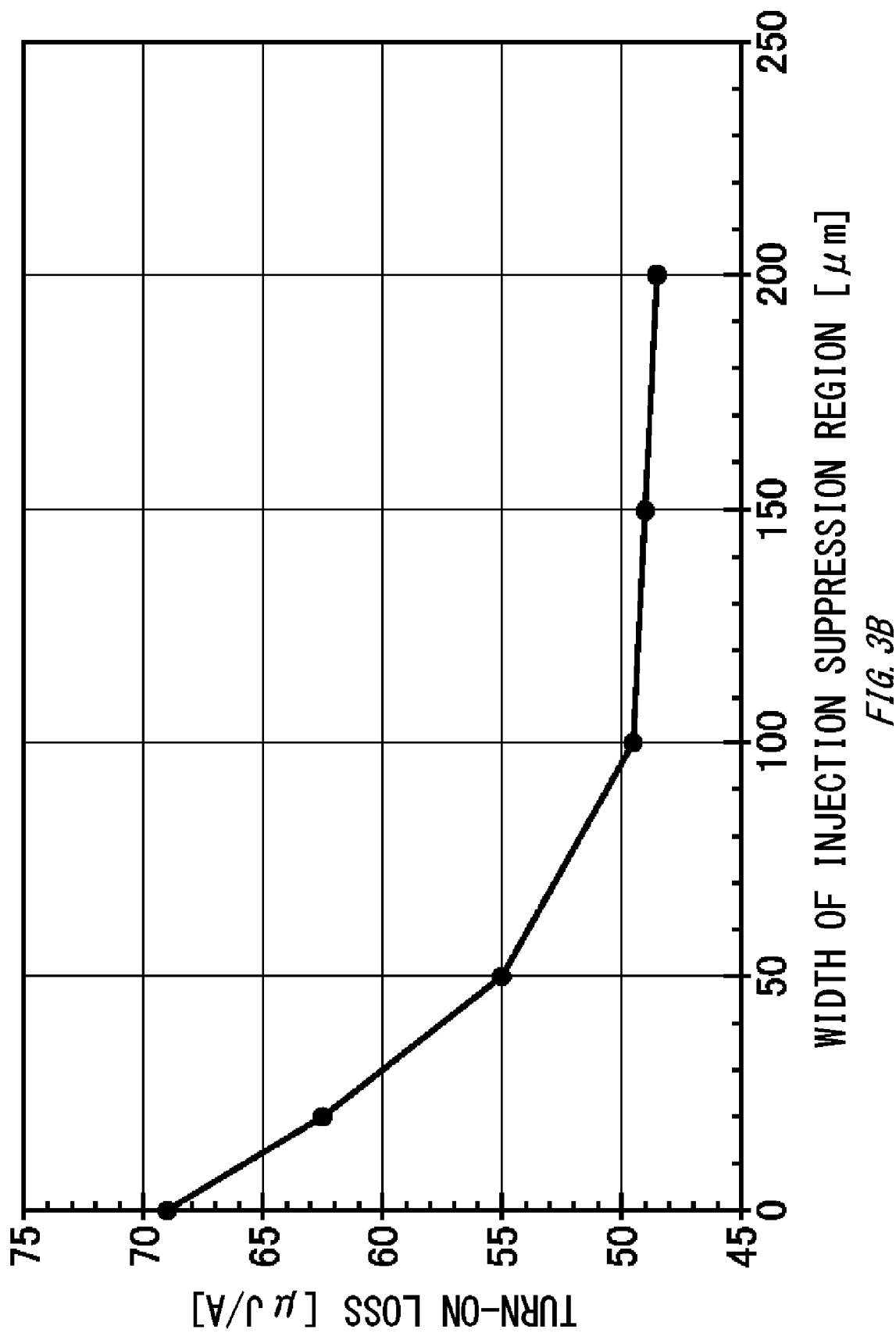
FIG. 3B is a graph illustrating a relationship between the width of the injection suppression region 90 and a turn-on loss.

FIG. 3B is a graph illustrating a relationship between the width of the injection suppression region 90 and the turn-on loss. The turn-on loss of the transistor portion 70 correlates with the reverse recovery loss since the reverse recovery current of the diode portion 80 of the opposing arm is added. As illustrated in the graph of FIG. 3B, when the width of the injection suppression region 90 is increased from 0 to 200 μm, the turn-on loss is reduced by 30.5%.

In this way, it can be seen from FIG. 3A and FIG. 3B that the reverse recovery loss decreases as the width of the injection suppression region 90 increases, and the turn-on loss also decreases as the reverse recovery loss decreases.

Figure 4A:
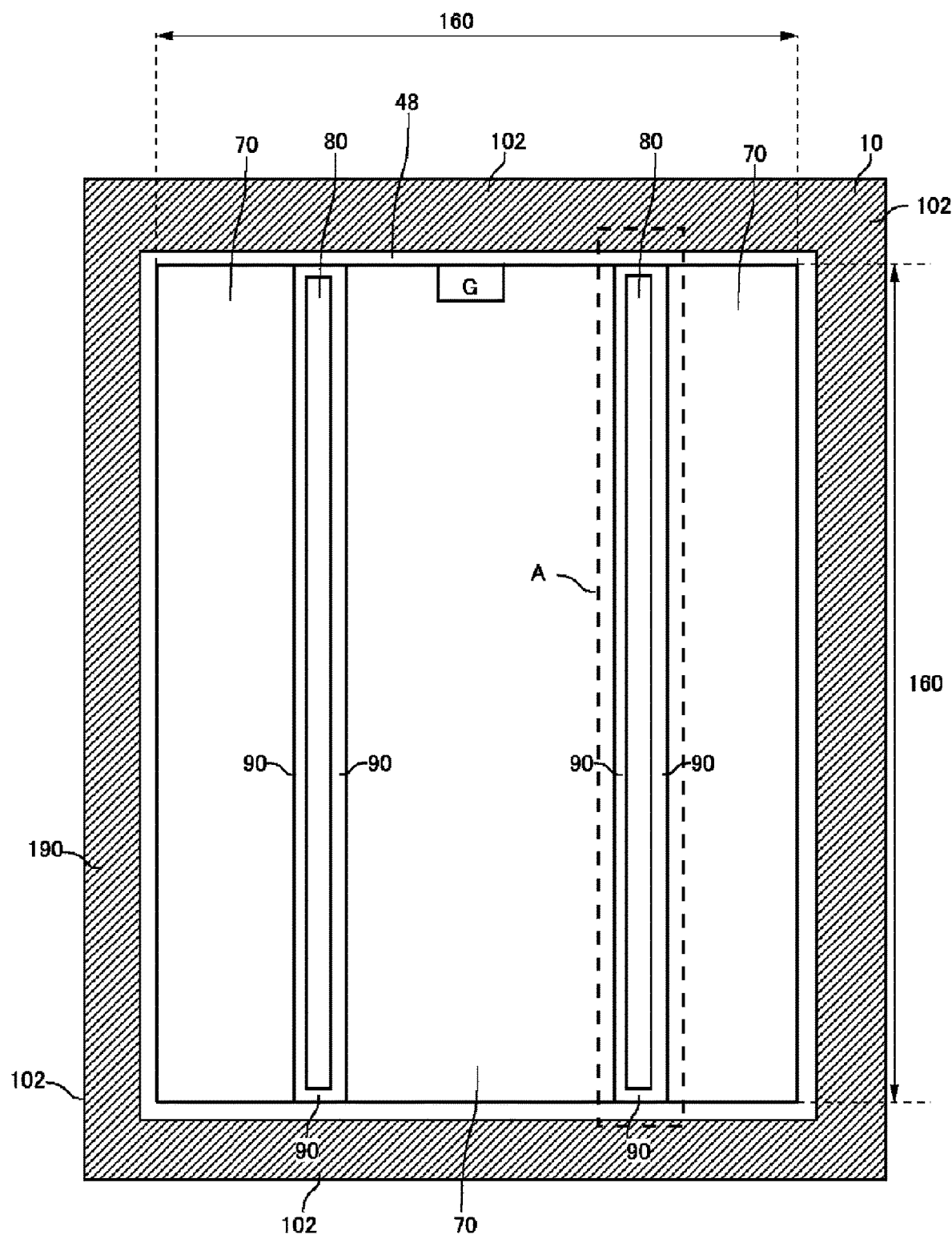
FIG. 4A is a top view of the semiconductor device 100 according to Example 1 of the present embodiment.

FIG. 4A is a top view of the semiconductor device 100 according to Example 1 of the present embodiment. FIG. 4A illustrates a position where each member is projected on the front surface 21 of the substrate 10. In FIG. 4A, only some members of the semiconductor device 100 are illustrated, and some members are omitted.

The substrate 10 of the semiconductor device 100 has two sets of end sides 102 facing each other in a top view. In FIG. 4A, the X axis and the Y axis are parallel to one of the end sides 102.

The substrate 10 is provided with an active region 160. The active region 160 is a region where a main current flows in the depth direction from the emitter region 12 of the substrate 10 in a case where the semiconductor device 100 operates. A region surrounded by the gate runner 48 in a top view may be the active region 160. Although an emitter electrode is provided above the active region 160, the emitter electrode is omitted in FIG. 4A.

At least one of the transistor portion 70 and the diode portion 80 is provided in the active region 160. The transistor portion 70 and the diode portion 80 of the present example are disposed alternately along a predetermined arrangement direction (the X axis direction in the present example) in the front surface 21 of the substrate 10. In another example, only one of the transistor portion 70 and the diode portion 80 may be provided in the active region 160.

The semiconductor device 100 may have one or more pads above the substrate 10. As an example, the semiconductor device 100 illustrated in FIG. 4A has a gate pad G in the active region 160. When the semiconductor device 100 is mounted, the gate pad G may be connected to an external circuit via wiring such as a wire.

A gate potential is applied to the gate pad G. The gate pad G and the gate runner 48 are electrically connected, and the gate runner 48 surrounds the active region 160 and is electrically connected to the gate conductive portion of the gate trench portion 40 of the active region 160.

The gate runner 48 is disposed between the active region 160 and an edge termination structure portion 190 of the substrate 10 in a top view. The gate runner 48 may be formed of a metal containing aluminum as a main component, such as polysilicon and an aluminum-silicon alloy.

The semiconductor device 100 of the present example includes an edge termination structure portion 190 between the active region 160 and the end side 102. The edge termination structure portion 190 of the present example is disposed between the gate runner 48 and the end side 102. The edge termination structure portion 190 reduces electric field strength on the front surface 21 side of the substrate 10.

The edge termination structure portion 190 may include a plurality of guard rings. The guard ring is a P type region in contact with front surface 21 of substrate 10. By providing the plurality of guard rings, the depletion layer on the upper surface side of the active region 160 can be extended outward, and the breakdown voltage of the semiconductor device 100 can be secured. The edge termination structure portion 190 may further include at least one of a field plate and a RESURF annularly provided to surround the gate runner 48.

Further, the semiconductor device 100 may include a temperature sense portion (not illustrated) that is a PN junction diode formed of polysilicon or the like, and a current detection portion (not illustrated) that operates similarly to the transistor portion provided in the active region 160.

Figure 4B:
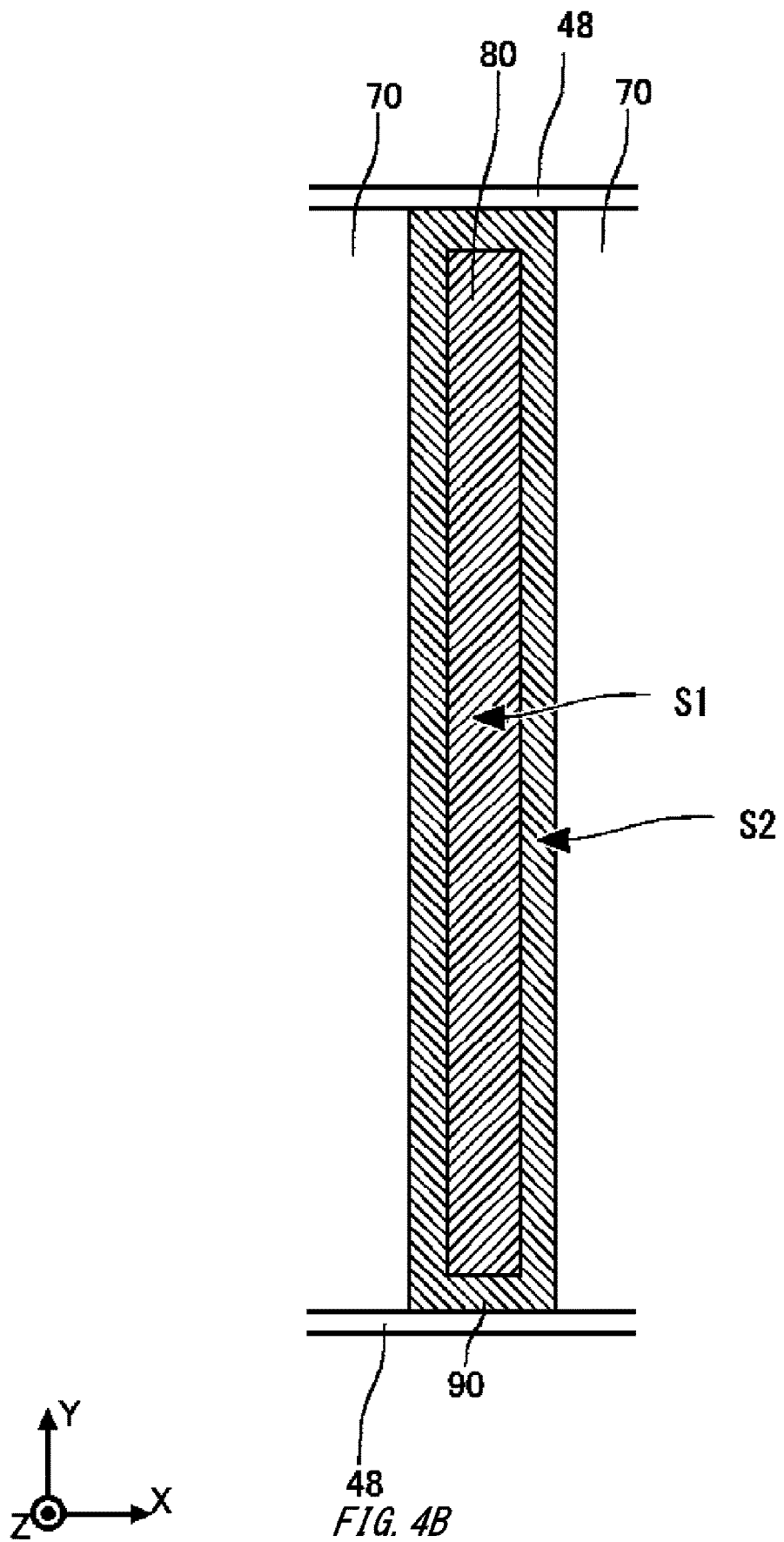
FIG. 4B is an enlarged view of portion A of FIG. 4A.

FIG. 4B is an enlarged view of portion A in FIG. 4A. FIG. 4B illustrates an example in which one injection suppression region 90 is viewed from the upper side (the positive side on the Z axis in FIG. 4B) to the lower side (the negative side on the Z axis).

The injection suppression region 90 is also provided between the end portion in the extending direction (Y axis direction) of the diode portion 80 and the outer periphery (gate runner 48) of the active region 160. That is, in a top view, the diode portion 80 is surrounded by the injection suppression region 90 at both the end portion in the extending direction and the end portion in the arrangement direction (X axis direction).

In FIG. 4B, an area S1 of the diode portion 80 and an area S2 of the injection suppression region 90 satisfy the following Expression (2).

$$S1 \geq (S1 + S2)/10 \qquad [\text{Expression}(2)]$$

By satisfying Expression (2), as the area S1 of the diode portion 80 is smaller, or the total area (S1+S2) of the diode portion 80 and the injection suppression region 90 is larger, hole injection from the transistor portion 70 is suppressed, and the reverse recovery and the turn-on loss are reduced. In addition, when the area S1 of the diode portion 80 is reduced, the ON voltage and the thermal resistance of the package increase. Therefore, in a case where it is desired to lower the ON voltage while securing the injection suppression region 90, the area of the substrate 10 is increased by S2.

On the other hand, also in a case where it is desired to increase the total area (S1+S2) of the diode portion 80 and the injection suppression region 90, the area of the substrate 10 is similarly enlarged by S2. On the other hand, in a case where the influence of the inverter loss is small even if the ON voltage rises, or in a case where the thermal resistance of the package structure portion is favorable and the temperature rise of the diode portion 80 is favorable, the area S1 of the diode portion 80 may be reduced without increasing the area of the substrate 10. Therefore, the ratio of the area S1 of the diode portion 80 may be 10% or more with respect to the total area (S1+S2) of the diode portion 80 and the injection suppression region 90.

In consideration of Expression (2), the total area of the diode portion 80 may be 1.4% or more and 22% or less of the area of the semiconductor device 100 in a top view.

Figure 4C:
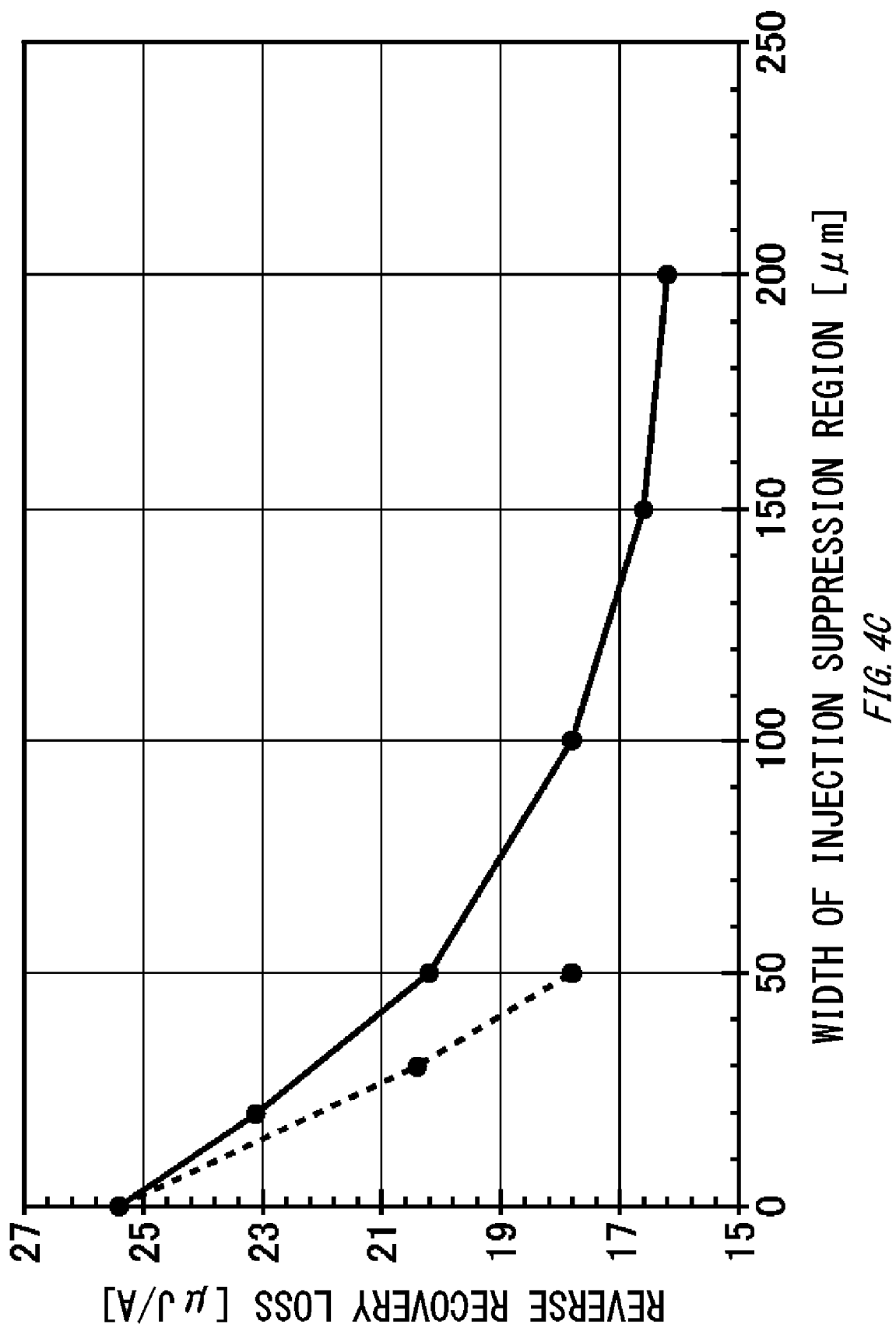
FIG. 4C is a graph illustrating a relationship between the width of the injection suppression region 90 and the reverse recovery loss.

FIG. 4C is a graph illustrating a relationship between the width of the injection suppression region 90 and the reverse recovery loss. A solid line indicates a reverse recovery loss in a case where the area of the diode portion 80 is fixed and the area (that is, the width of the collector region 22) of the transistor portion 70 is reduced in accordance with an increase in the width of the injection suppression region 90, and a broken line indicates a reverse recovery loss in a case where the area (that is, the width of the cathode region 82) of the diode portion 80 is reduced in accordance with an increase in the width of the injection suppression region 90.

As illustrated in the graph of FIG. 4C, when the width of the injection suppression region 90 increases, the reverse recovery loss is reduced in both the case where the area of the diode portion 80 is fixed and the case where the area of the diode portion 80 is reduced.

However, in a case where the area of the diode portion 80 is reduced, when the width of the injection suppression region 90 increases from 0 μm to 50 μm, the reverse recovery loss decreases by about 30%, whereas in a case where the area of the diode portion 80 is fixed, the decrease in the reverse recovery loss remains at 21%. In this way, it can be seen that the reverse recovery loss is greatly reduced by 9% in a case where the area of the diode portion 80 is reduced as compared with a case where the area of the diode portion 80 is fixed.

Example 2

FIG. 5A is a partial sectional view of a semiconductor device 200 according to Example 2 of the present embodiment. Here, elements common to the semiconductor device 100 are denoted by the same reference numerals, and description thereof is omitted.

In the injection suppression region 90 of the semiconductor device 200, a base region 94 of the second conductivity type is provided instead of the base region 14. The doping concentration of the base region 94 may range from $1E+16$ $cm^{-3}$ to $5E+19$ $cm^{-3}$.

Note that the doping concentration of the base region 14 may range from $1E+16$ $cm^{-3}$ to $1E+18$ $cm^{-3}$, and the doping concentration of the extraction region 15 may range from $5+E+18$ $cm^{-3}$ to $5E+20$ $cm^{-3}$.

By making the doping concentration of the base region 94 lower than that of the extraction region 15, the effect of suppressing the hole injection from the transistor portion 70 can be enhanced. When the concentration of the base region 14 is lower than that of the base region 94, the effect of suppressing the hole injection can be further enhanced.

In addition, a processing method for dividing the doping concentrations of the base region 14 and the base region 94 is as follows. In a case where the doping concentration of the base region 94 is higher than that of the base region 14, both the base regions 14 and 94 are doped, and then the base region 14 is doped with a mask to space the base region 94. On the other hand, in a case where the doping concentration of the base region 94 is lower than that of the base region 14, the base region 14 and the base region 94 are processed by doping using different masks.

In addition, when the doping concentrations of the base region 94 and the base region 14 are equal, processing can be performed using a similar mask. Therefore, it is not necessary to add a mask, and it is possible to improve the processing ability and reduce the cost of the chip by reducing the mask.

Figure 5B:
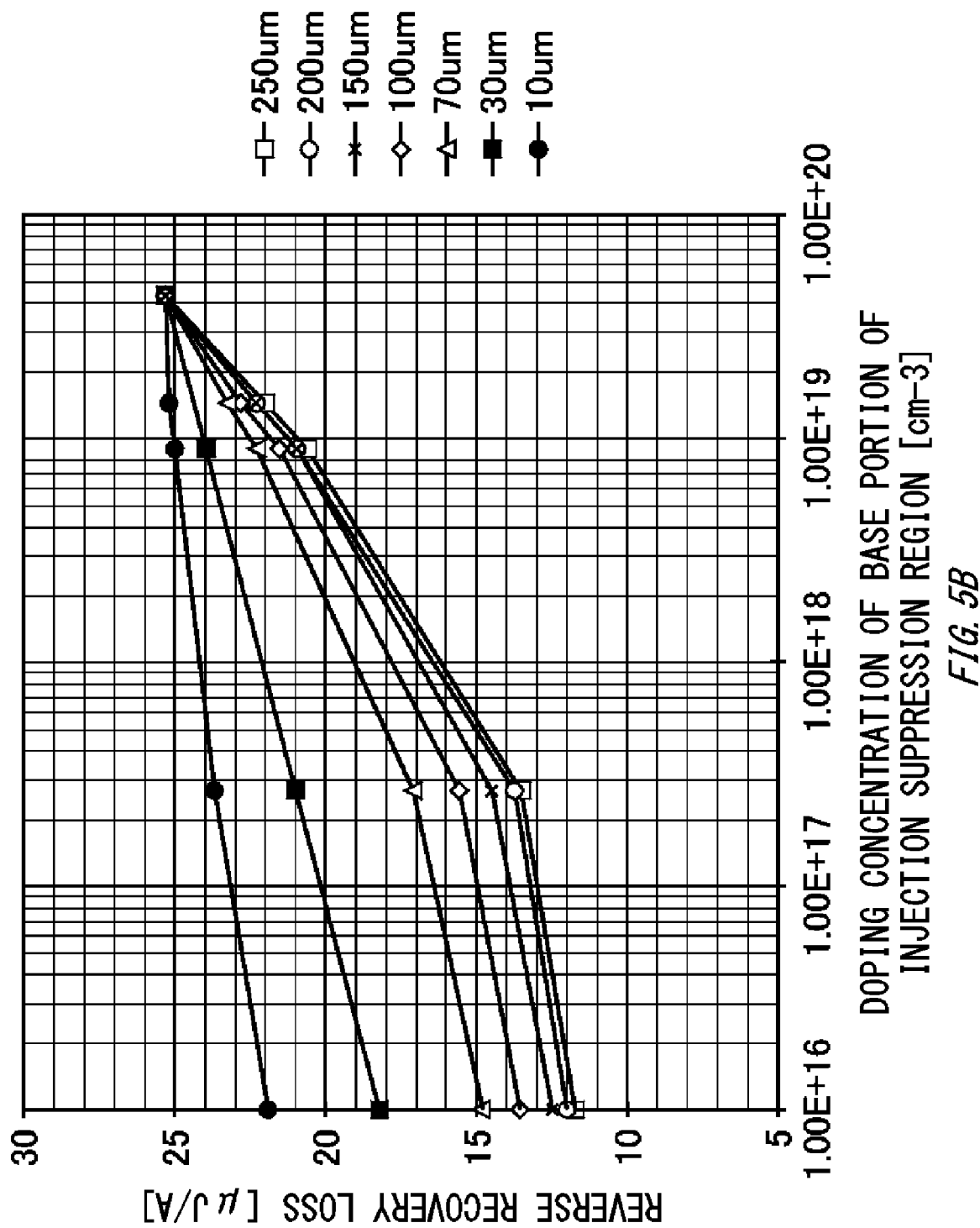
FIG. 5B is a graph illustrating a relationship between a doping concentration of a base region 94 of the injection suppression region 90 and the reverse recovery loss.

FIG. 5B is a graph illustrating a relationship between the doping concentration of the base region 94 of the injection suppression region 90 and the reverse recovery loss. Here, as an example, boron is injected as an impurity.

In FIG. 5B, the width of the injection suppression region 90 is set in seven patterns in a range of 10 μm to 250 μm, and the doping concentration of boron in the base region 94 is decreased from the order of $E+19$ $cm^{-3}$ to the order of $E+16$ $cm^{-3}$ in each pattern, and a change in the reverse recovery loss is observed.

First, in a case where the doping concentration of the base region 94 is on the order of $E+19$ $cm^{-3}$, which is a reference concentration similar to that of the extraction region 15, the improvement width of the reverse recovery loss is 1.2% regardless of the width of any injection suppression region 90, and a large difference is not observed. Next, as the doping concentration of the base region 94 is decreased from the reference concentration, the dependency on the width of the injection suppression region 90 increases, and the reverse recovery loss is significantly reduced.

Even when the doping concentration of the base region 94 decreases to the order of $E+16$ $cm^{-3}$, in a pattern in which the width of the injection suppression region 90 is 10 μm, the reverse recovery loss decreases by about 5.9%, and a large difference from the reverse recovery loss at the reference concentration is not observed. On the other hand, in a pattern in which the width of the injection suppression region 90 is 250 μm, the reverse recovery loss is significantly reduced to about 46%.

Figure 5C:
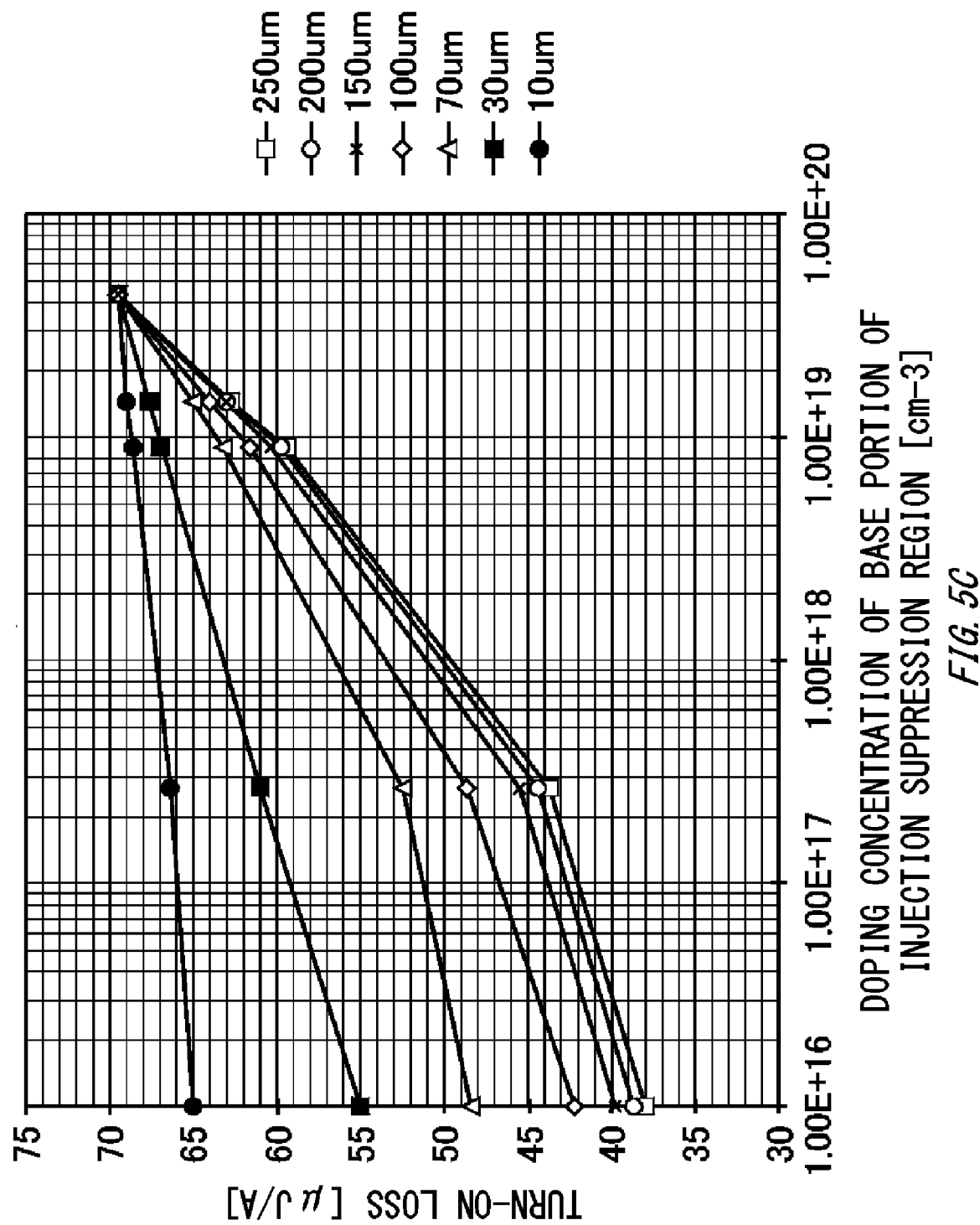
FIG. 5C is a graph illustrating a relationship between the doping concentration and the turn-on loss of the base region 94 of the injection suppression region 90.

FIG. 5C is a graph illustrating a relationship between the doping concentration of the base region 94 of the injection suppression region 90 and the turn-on loss. Since the setting of the width of the injection suppression region 90 and the like are the same as those in FIG. 5B, the description thereof is omitted.

Also from the graph of FIG. 5C, it can be seen that the larger the width of the injection suppression region 90 while lowering the doping concentration of the base region 94, the more effectively the turn-on loss is reduced. Note that the concentration on the order of $E+17$ $cm^{-3}$ is substantially at the same level as the doping concentration of the base region 14.

Example 3

Figure 6A:
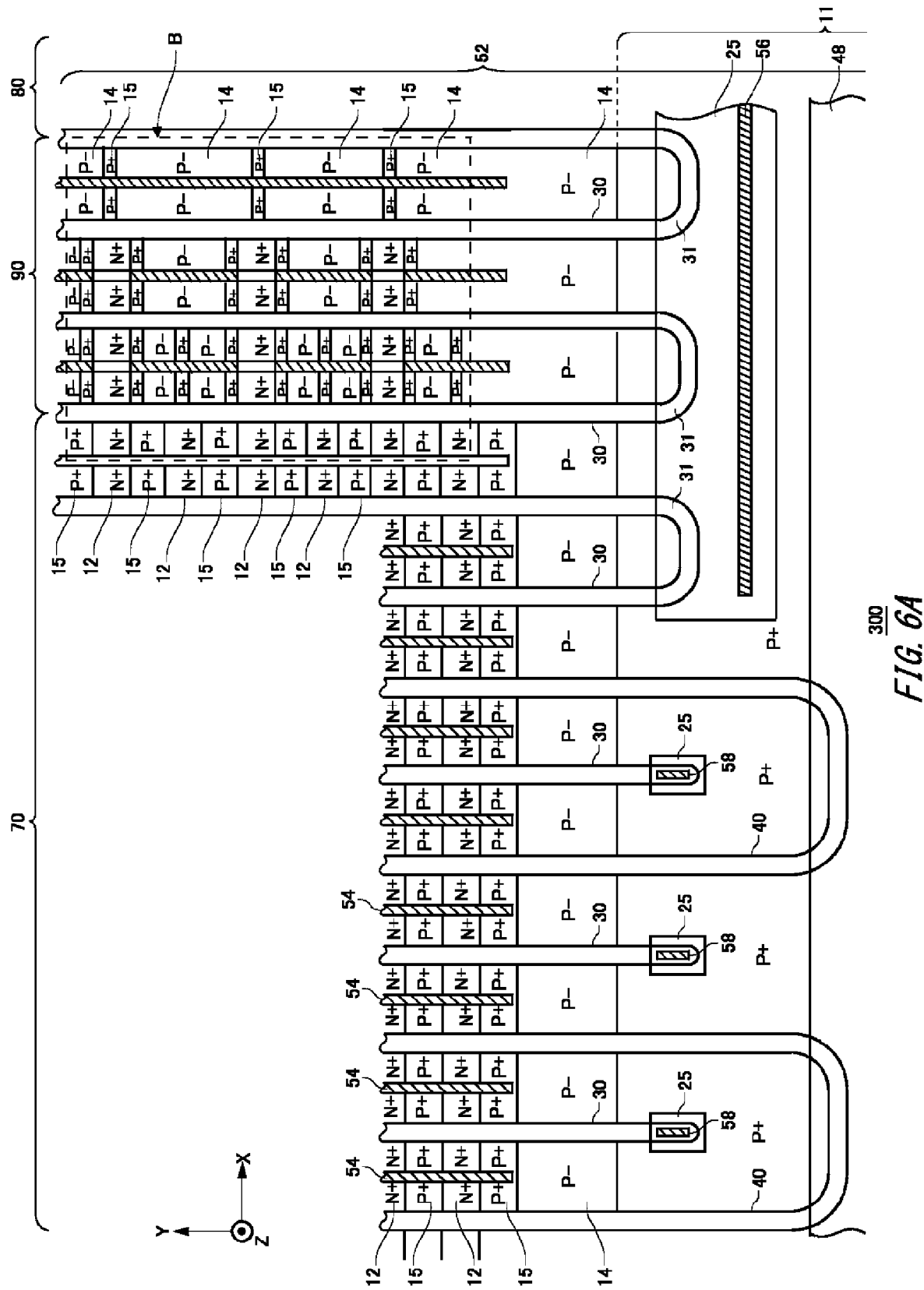
FIG. 6A is a partial top view of a semiconductor device 300 according to Example 3 of the present embodiment.

FIG. 6A is a partial top view of a semiconductor device 300 according to Example 3 of the present embodiment. Here, elements common to the semiconductor device 100 are denoted by the same reference numerals, and description thereof is omitted.

Similarly to the semiconductor devices 100 and 200, the injection suppression region 90 of the semiconductor device 300 includes the dummy trench portion 30 and does not include the gate trench portion 40. However, unlike the semiconductor devices 100 and 200, the injection suppression region 90 of the semiconductor device 300 includes the emitter region 12 and the extraction region 15 exposed to the front surface 21. However, the ratio of the emitter region 12 and the extraction region 15 in the injection suppression region 90 is lower than the ratio of the emitter region 12 and the extraction region 15 in the transistor portion 70.

As illustrated in FIG. 6A, in the injection suppression region 90, the emitter region 12 and the extraction region 15 are smaller than those of the transistor portion 70. In the injection suppression region 90, the base region 14 is provided in a portion where the emitter region 12 and the extraction region 15 are not provided.

That is, in the transistor portion 70, the emitter region 12 and the extraction region 15 are alternately disposed in the extending direction (Y axis direction in FIG. 6A), but in the injection suppression region 90, the extraction region 15 is disposed around the emitter region 12, and the base region 14 is provided around the extraction region 15.

In this way, in the semiconductor device 300, hole injection can be suppressed and the loss can be reduced by reducing the ratio of the extraction region 15 in the injection suppression region 90. In addition, since the injection suppression regions 90 of the semiconductor devices 100 and 200 do not have the emitter region 12, an electron current does not flow from the emitter region 12, but in the semiconductor device 300, since the injection suppression region 90 has the emitter region 12, an electron current flows. Therefore, the ON voltage can be reduced as compared with the semiconductor devices 100 and 200.

Figure 6B:
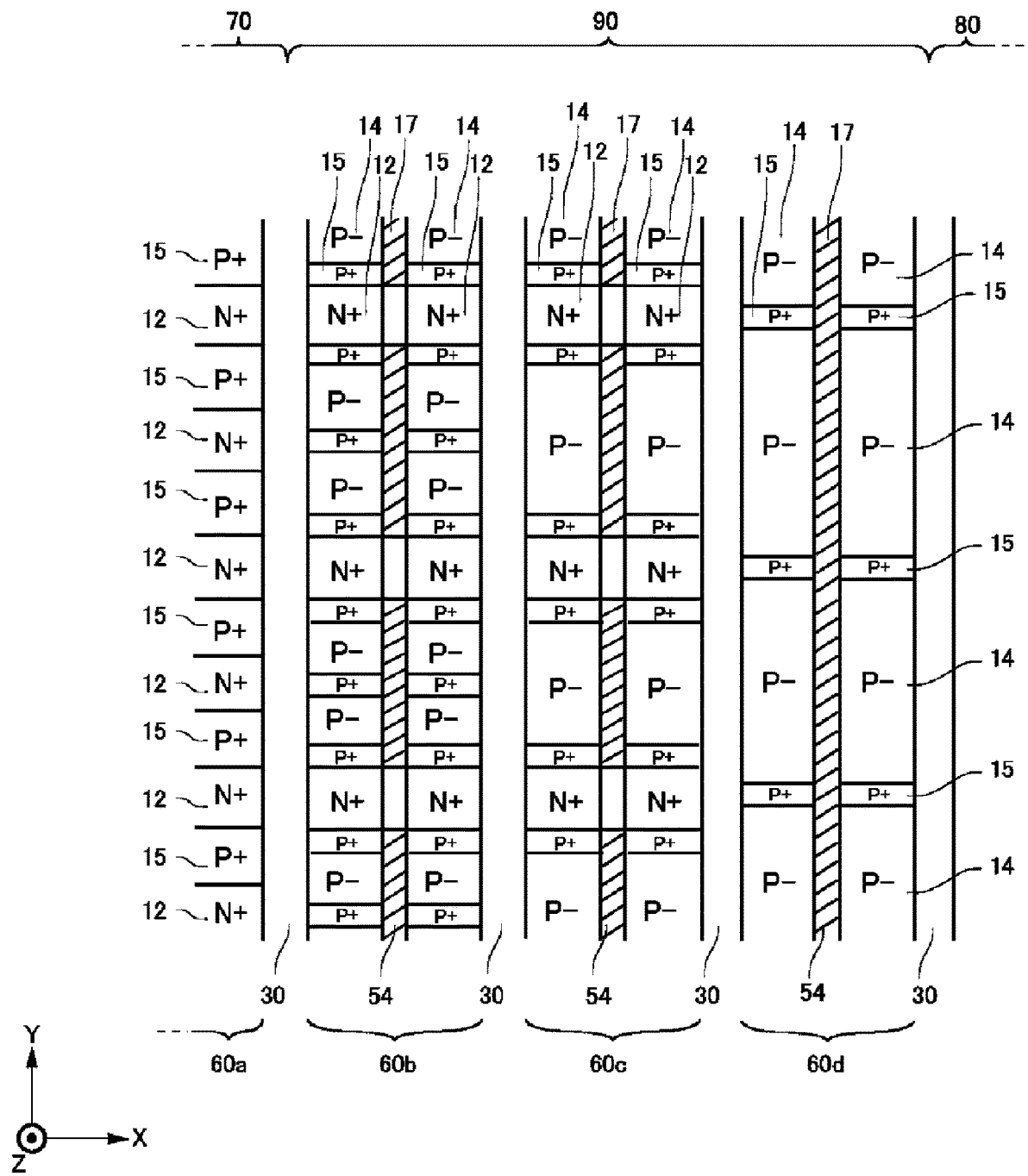
FIG. 6B is an enlarged view of portion B in FIG. 6A.

FIG. 6B is an enlarged view of portion B in FIG. 6A. Here, the arrangement of the emitter region 12 and the extraction region 15 in the injection suppression region 90 will be mainly described.

In FIG. 6B, a mesa portion adjacent to the injection suppression region 90 in the mesa portion 60 of the transistor portion 70 is defined as a first mesa portion 60a, a mesa portion adjacent to the transistor portion 70 in the mesa portion 60 of the injection suppression region 90 is defined as a second mesa portion 60b, a mesa portion adjacent to the second mesa portion 60b is defined as a third mesa portion 60c, and a mesa portion adjacent to the diode portion 80 is defined as a fourth mesa portion 60d.

Although the injection suppression region 90 of the present example includes three mesa portions of the second mesa portion 60b to the fourth mesa portion 60d, the number of mesa portions is not limited thereto.

In the second mesa portion 60b to the fourth mesa portion 60d, either the emitter region 12 or the extraction region 15 is disposed so as to be adjacent to each of the emitter regions 12 disposed in the adjacent mesa portions on the negative side on the X axis.

In the first mesa portion 60a, six emitter regions 12 and six extraction regions 15 are alternately disposed in the Y axis direction. Out of the six emitter regions 12 of the first mesa portion 60a, every other three emitter regions 12 are respectively adjacent to the three emitter regions 12 disposed in the second mesa portion 60b, and the remaining three emitter regions 12 are respectively adjacent to the three extraction regions 15 disposed in the second mesa portion 60b.

The three emitter regions 12 of the second mesa portion 60b are adjacent to the three emitter regions 12 of the third mesa portion 60c, respectively. Alternatively, in the third mesa portion 60c, the extraction region 15 may be disposed instead of a part of the disposed three emitter regions 12.

In the second mesa portion 60b and the third mesa portion 60c, the emitter region 12 is adjacent to the extraction region 15 in the Y axis direction. That is, the emitter region 12 is surrounded by the extraction region 15 on the positive side and the negative side in the Y axis. As a result, holes generated by conductivity modulation can be extracted to the extraction region 15, so that latch-up withstand capability can be improved.

In the second mesa portion 60b and the third mesa portion 60c, the base region 14 is disposed in a region where the emitter region 12 and the extraction region 15 are not disposed.

The emitter region 12 is not disposed in the fourth mesa portion 60d. The extraction region 15 is disposed in the fourth mesa portion 60d, and is adjacent to the emitter region 12 of the adjacent third mesa portion 60c on the negative side on the X axis. In the fourth mesa portion 60d, the base region 14 is disposed in a region where the extraction region 15 is not disposed.

Alternatively, in a case where the emitter region 12 is not disposed in the third mesa portion 60c adjacent to the fourth mesa portion 60d on the negative side on the X axis, only the base region 14 may be disposed in the fourth mesa portion 60d.

As described above, the ratio of the extraction region 15 in each mesa portion of the injection suppression region 90 is equal to or less than the ratio of the extraction region 15 in the mesa portion adjacent on the negative side on the X axis. That is, the ratio of the extraction region 15 in the second mesa portion 60b is equal to or less than the ratio of the extraction region 15 in the first mesa portion 60a. The ratio of the extraction region 15 in the third mesa portion 60c is equal to or less than the ratio of the extraction region 15 in the second mesa portion 60b. The ratio of the extraction region 15 in the fourth mesa portion 60d is equal to or less than the ratio of the extraction region 15 in the third mesa portion 60c, and equal to or more than the ratio of the extraction region 15 in the mesa portion 61 of the diode portion 80 adjacent on the positive side on the X axis.

In a case where the width of the injection suppression region 90 is increased, the number of the third mesa portions 60c may be increased. Since the ratio of the extraction region 15 in the injection suppression region 90 can be reduced by increasing the number of the third mesa portions 60c, the reverse recovery loss and the turn-on loss can be reduced.

Further, since the emitter region 12 is provided in the third mesa portion 60c, the area of the region operating as the transistor portion increases, and the ON voltage can be reduced.

Note that, in FIG. 6B, the extraction region 15 of the injection suppression region 90 is disposed over the entire mesa portion in the X axis direction, but may have a length about half the length of the mesa portion in the X axis direction. In the injection suppression region 90, the length of the extraction region 15 in the X axis direction may be 0.3 µm or more.

In addition, in the injection suppression region 90, the length of the extraction region 15 in the Y axis direction is equal to or less than the length of the extraction region 15 of the transistor portion 70 in the Y axis direction. In the injection suppression region 90, the length of the extraction region 15 in the Y axis direction may be 0.5 µm or more. This makes it possible to improve the latch-up withstand capability while suppressing hole injection.

Note that the plug region 17 is disposed in the hatched portion of the contact hole 54 illustrated in FIG. 6B.

Example 4

Figure 7A:
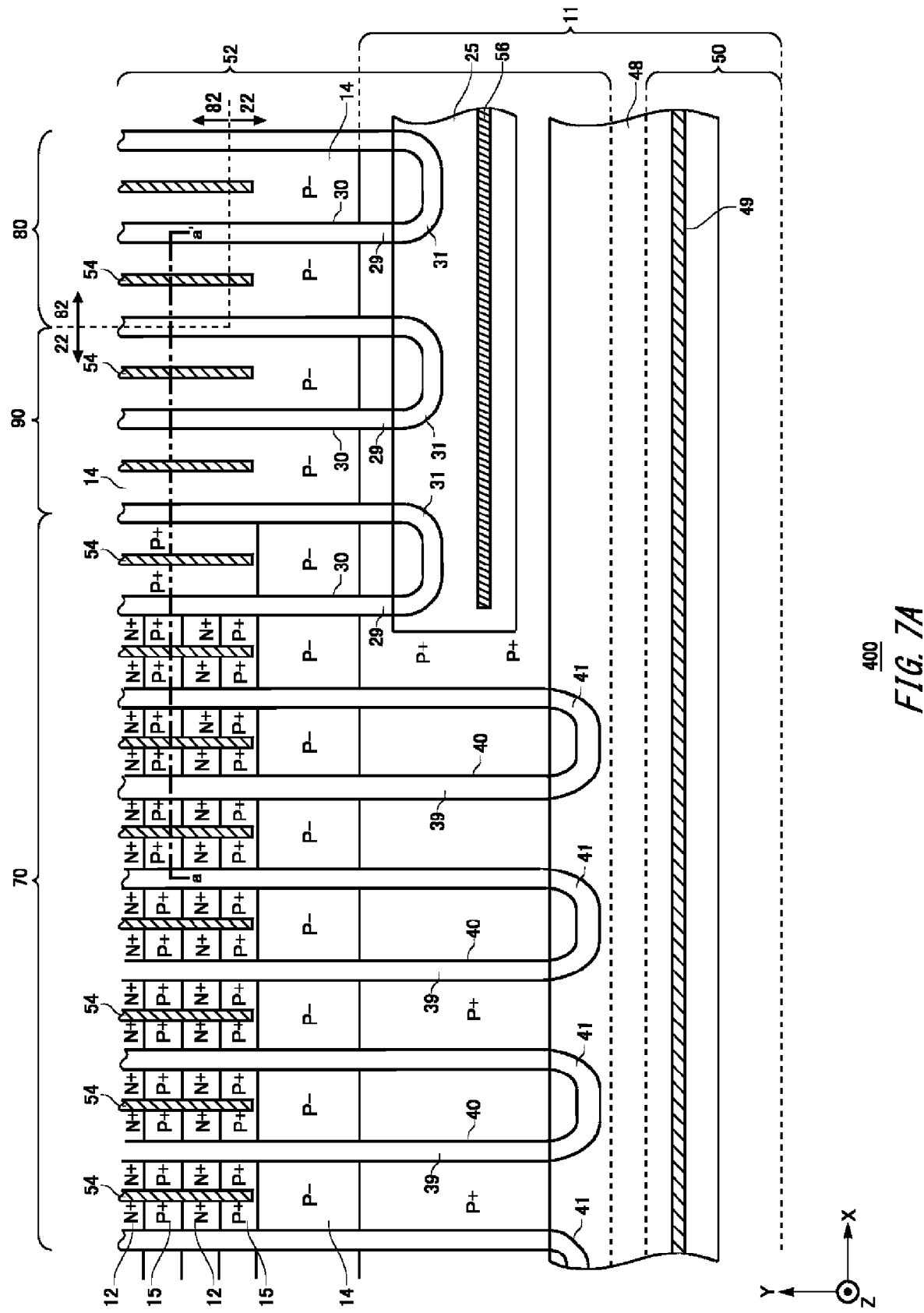
FIG. 7A is a partial top view of a semiconductor device 400 according to Example 4 of the present embodiment.
Figure 7B:
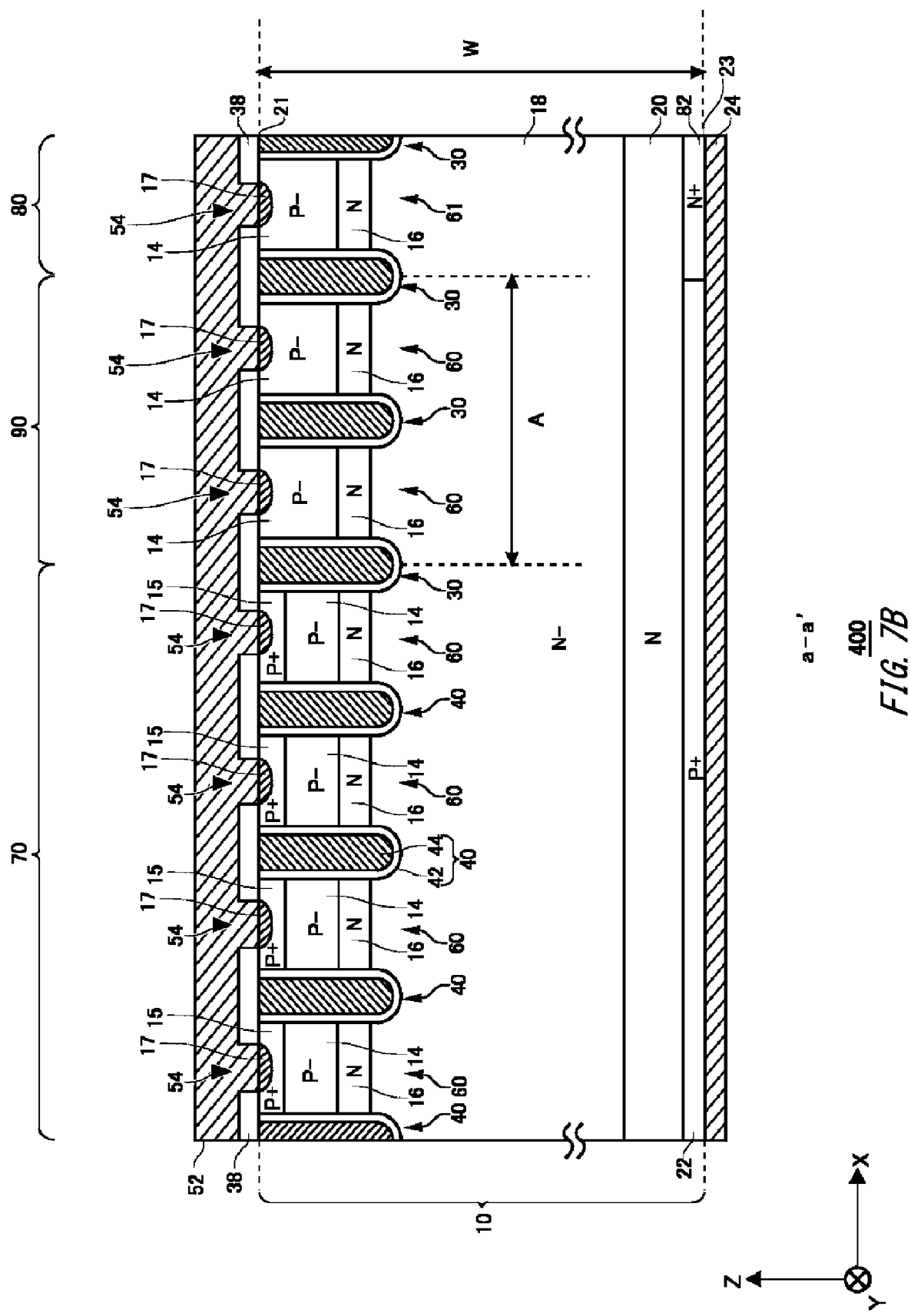
FIG. 7B is a diagram illustrating a cross section taken along line a-a' in FIG. 7A.

FIG. 7A is a partial top view of a semiconductor device 400 according to Example 4 of the present embodiment. FIG. 7B is a diagram illustrating a cross section taken along line a-a' in FIG. 7A. Here, elements common to the semiconductor device 100 are denoted by the same reference numerals, and description thereof is omitted.

In the present example, the transistor portion 70 is provided with a plurality of gate trench portions 40 along the arrangement direction, and the diode portion 80 is provided with a plurality of dummy trench portions 30 along the arrangement direction.

The transistor portion 70 of the present example has a full gate structure in which the dummy trench portion 30 is not provided. Each of the gate trench portions 40 is connected to the adjacent gate trench portion 40 via the edge portion 41.

Figure 7C:
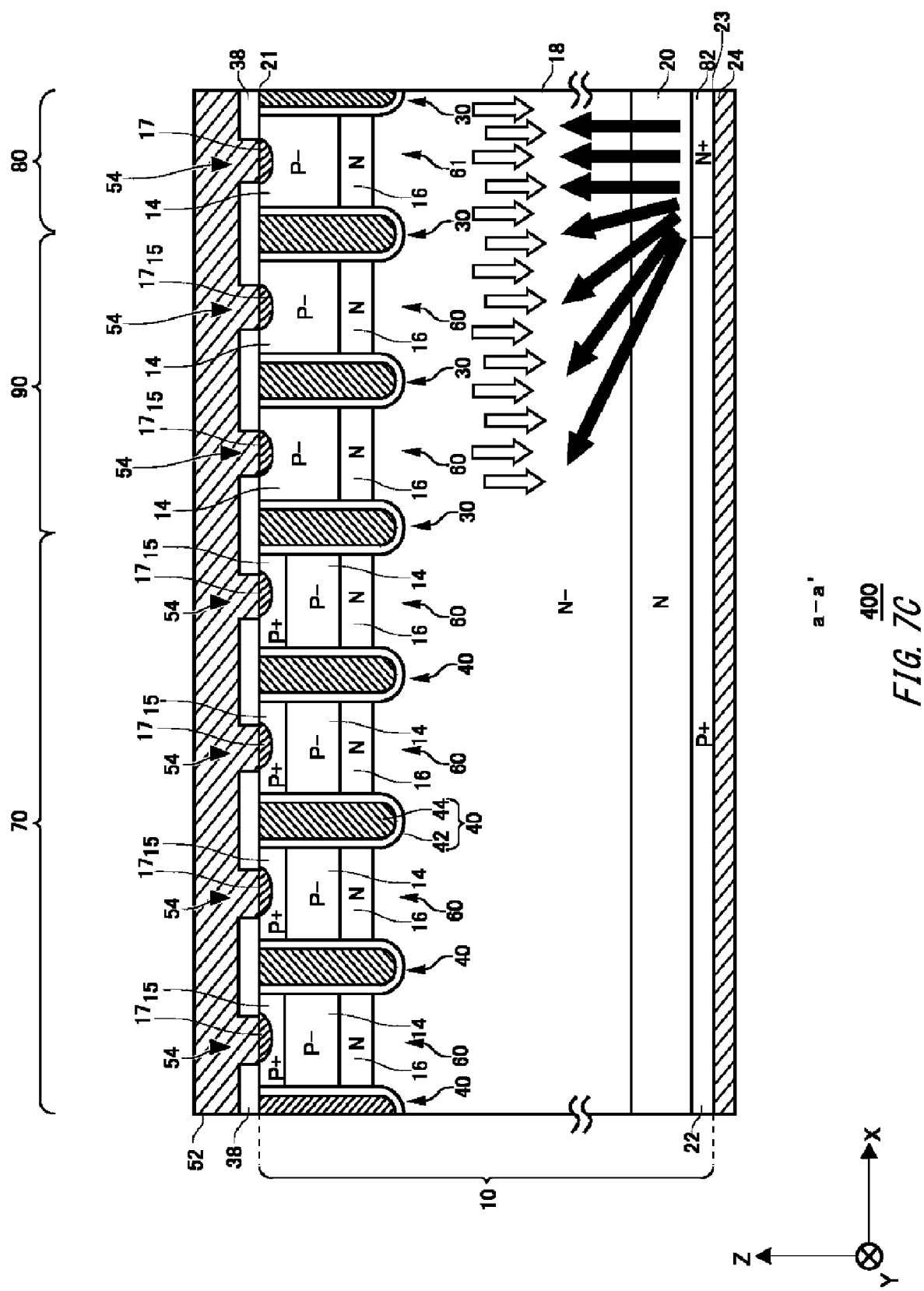
FIG. 7C is a diagram for explaining an operation of the diode portion 80 of the semiconductor device 400 during conduction.

FIG. 7C is a diagram for explaining the operation of the diode portion 80 of the semiconductor device 400 during conduction. FIG. 7C, like FIG. 7B, illustrates the a-a' cross section of FIG. 7A. Here, the same elements as those of the semiconductor device 100 are denoted by the same reference numerals, and description thereof is omitted.

As can be seen from FIG. 7C, by providing the injection suppression region 90, hole injection from the transistor portion 70 is suppressed, and the reverse recovery loss is improved. In this way, also in the semiconductor device 400 having the full gate structure, the same effect as that of the semiconductor devices 100 to 300 in which the dummy trench portion 30 is provided in the transistor portion 70 can be obtained.

Example 5

Figure 8A:
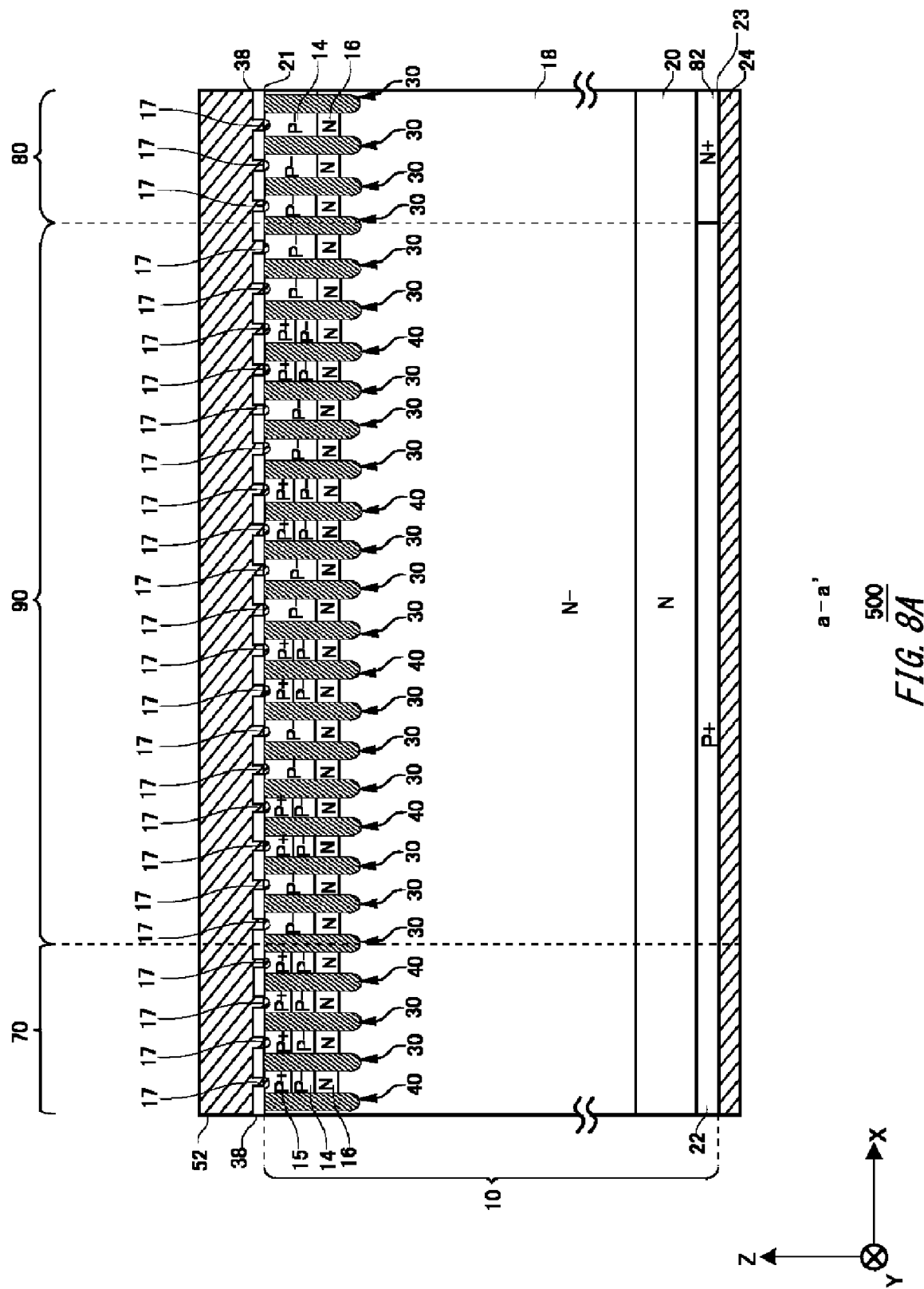
FIG. 8A is a partial sectional view of a semiconductor device 500 according to Example 5 of the present embodiment.

FIG. 8A is a partial sectional view of a semiconductor device 500 according to Example 5 of the present embodiment. FIG. 8A is a diagram illustrating a cross section taken along line a-a' in FIG. 8B and FIG. 8C described later. The a-a' cross section is an XZ plane including the gate trench portion 40 and the dummy trench portion 30 and passing through the extraction region 15 and the base region 14. Here, elements common to the semiconductor device 100 are denoted by the same reference numerals, and description thereof is omitted.

The transistor portion 70 of the present example includes the gate trench portion 40 and the dummy trench portion 30 provided along the X axis direction. In FIG. 8A, the gate insulating film 42 and the dummy insulating film 32 are omitted.

Unlike the semiconductor devices 100 to 400, the injection suppression region 90 of the present example includes the gate trench portion 40 and the dummy trench portion 30 provided along the X axis direction. However, the dummy ratio in the injection suppression region 90 is higher than the dummy ratio in the transistor portion 70. Here, the dummy ratio means a ratio of the number of dummy trench portions 30 to the total number of gate trench portions 40 and dummy trench portions 30.

In the example illustrated in FIG. 8A, in the transistor portion 70, one gate trench portion 40 and two dummy trench portions 30 are alternately disposed in the X axis direction. The dummy ratio in such an arrangement is about 67%.

In addition, in the injection suppression region 90, one gate trench portion 40 and three dummy trench portions 30 are alternately disposed in the X axis direction. The dummy ratio in such an arrangement is 75%.

On the other hand, the diode portion 80 includes the dummy trench portion 30 provided along the X axis direction and does not include the gate trench portion 40. Therefore, the dummy ratio of the diode portion 80 is 100%.

In this way, in the semiconductor device 500, the dummy ratio of the diode portion 80 is higher than the dummy ratio of the injection suppression region 90, and the dummy ratio of the injection suppression region 90 is higher than the dummy ratio of the transistor portion 70.

Although the dummy trench portion 30 is disposed at the boundary between the transistor portion 70 and the injection suppression region 90, the present invention is not limited thereto. The gate trench portion 40 may be disposed at the boundary between the transistor portion 70 and the injection suppression region 90. The dummy trench portion 30 may be disposed at the boundary between the injection suppression region 90 and the diode portion 80.

Further, in the semiconductor device 500, the plug is provided in a contact hole in contact with the extraction region 15 or the base region 14. In addition, a P++ type plug region 17 having a higher doping concentration than the extraction region 15 is formed below the contact hole of the plug.

Figure 8B:
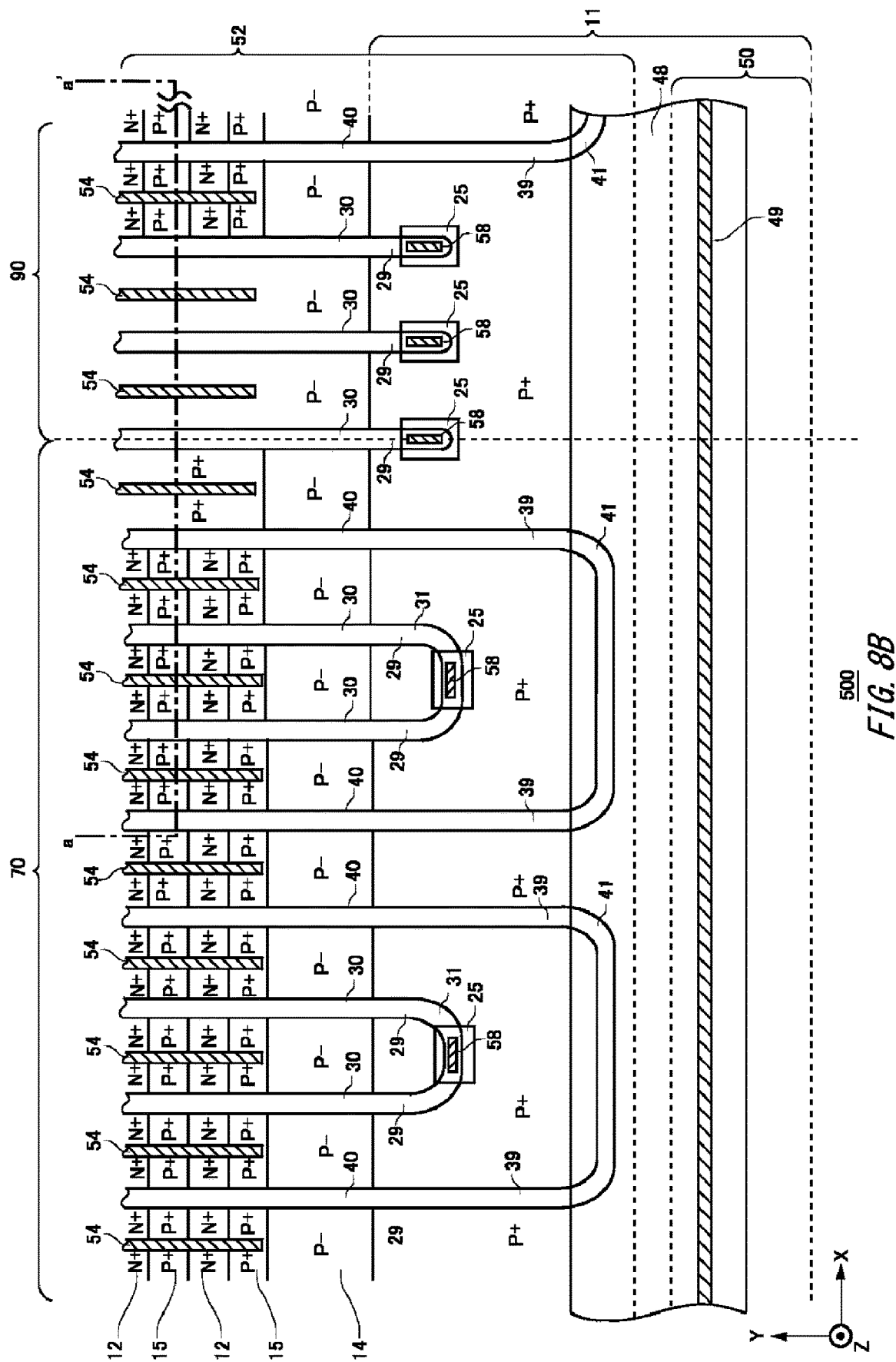
FIG. 8B is a partial top view of the semiconductor device 500.

FIG. 8B is a partial top view of the semiconductor device 500. FIG. 8B mainly illustrates the transistor portion 70. The transistor portion 70 of the present example includes the gate trench portion 40 and the dummy trench portion 30 provided along the X axis direction.

In the example illustrated in FIG. 8B, in the transistor portion 70, the straight portions 29 of the two dummy trench portions 30 are disposed between the straight portions 39 of the two gate trench portions 40. The end portions of the two straight portions 39 in the Y axis direction are connected to each other by the edge portion 41 with the gate runner 48.

In the present example, the dummy ratio of the transistor portion 70 ranges from 0% to 75%. In the transistor portion 70, the ratio between the number of gate trench portions 40 and the number of dummy trench portions 30 may be 1:0 (so-called full gate structure), 1:1 (structure in which one gate trench portion 40 and one dummy trench portion 30 are alternately disposed in the X axis direction), 1:2 (structure in which one gate trench portion 40 and two dummy trench portions 30 are alternately disposed in the X axis direction), or 1:3 (structure in which one gate trench portion 40 and three dummy trench portions 30 are alternately disposed in the X axis direction).

Figure 8C:
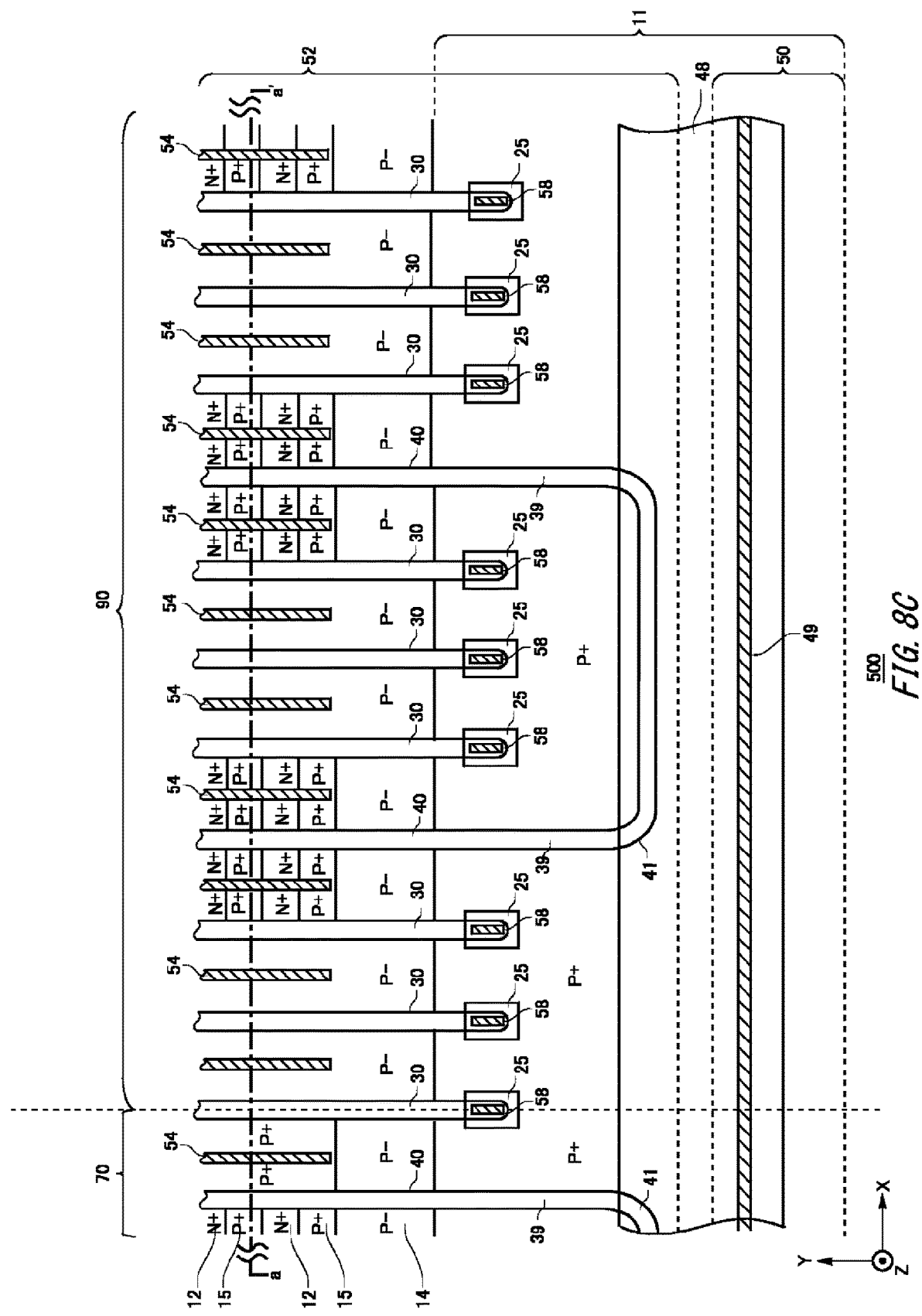
FIG. 8C is a partial top view of the semiconductor device 500.

FIG. 8C is a partial top view of the semiconductor device 500. FIG. 8C illustrates the injection suppression region 90 as a center. The injection suppression region 90 of the present example includes the gate trench portion 40 and the dummy trench portion 30 provided along the X axis direction.

In the example illustrated in FIG. 8C, in the injection suppression region 90, the straight portions 29 of the three dummy trench portions 30 are disposed between the straight portions 39 of the two gate trench portions 40. The end portions of the two straight portions 39 in the Y axis direction are connected to each other by the edge portion 41 with the gate runner 48.

In the injection suppression region 90, the emitter region 12 is disposed in the mesa portion 60 adjacent to the gate trench portion 40. In addition, in the injection suppression region 90, the emitter region 12 and the extraction region 15 are alternately disposed in the Y axis direction.

In the injection suppression region 90, the base region 14 is disposed in a portion where the emitter region 12 and the extraction region 15 are not disposed. That is, in the injection suppression region 90, the emitter region 12 and the extraction region 15 are not disposed in the mesa portion 60 adjacent to the dummy trench portion 30, and the base region 14 is disposed.

The dummy ratio of the injection suppression region 90 is higher than that of the transistor portion 70, and the emitter region 12 and the extraction region 15 are disposed in the mesa portion 60 adjacent to the gate trench portion 40. Therefore, the ratio of the emitter region 12 and the extraction region 15 in the injection suppression region 90 is lower than that of the transistor portion 70. As a result, hole injection is suppressed, and the reverse recovery loss is improved.

That is, by reducing the extraction region 15 in the injection suppression region 90, the same effect as the case where the doping concentration of the base region 94 of the injection suppression region 90 is reduced can be obtained as described in Example 2.

On the other hand, since the injection suppression region 90 includes the emitter region 12, an electron current flows.

As a result, the injection suppression region 90 partially performs the transistor operation, and the deterioration of the ON voltage can be suppressed.

The emitter region 12 is surrounded by the extraction region 15 on the positive side and the negative side in the Y axis. As a result, holes generated by conductivity modulation can be extracted to the extraction region 15, so that latch-up withstand capability can be improved.

In the present example, the dummy ratio of the injection suppression region 90 ranges from 75% to 87.5%. In the injection suppression region 90, the ratio between the number of gate trench portions 40 and the number of dummy trench portions 30 may be 1:3 (structure in which one gate trench portion 40 and three dummy trench portions 30 are alternately disposed in the X axis direction), 1:4 (structure in which one gate trench portion 40 and four dummy trench portions 30 are alternately disposed in the X axis direction), 1:5 (structure in which one gate trench portion 40 and five dummy trench portions 30 are alternately arranged in the X axis direction), 1:6 (structure in which one gate trench portion 40 and six dummy trench portions 30 are alternately disposed in the X axis direction), or 1:7 (structure in which one gate trench portion 40 and seven dummy trench portions 30 are alternately arranged in the X axis direction).

Figure 8D:
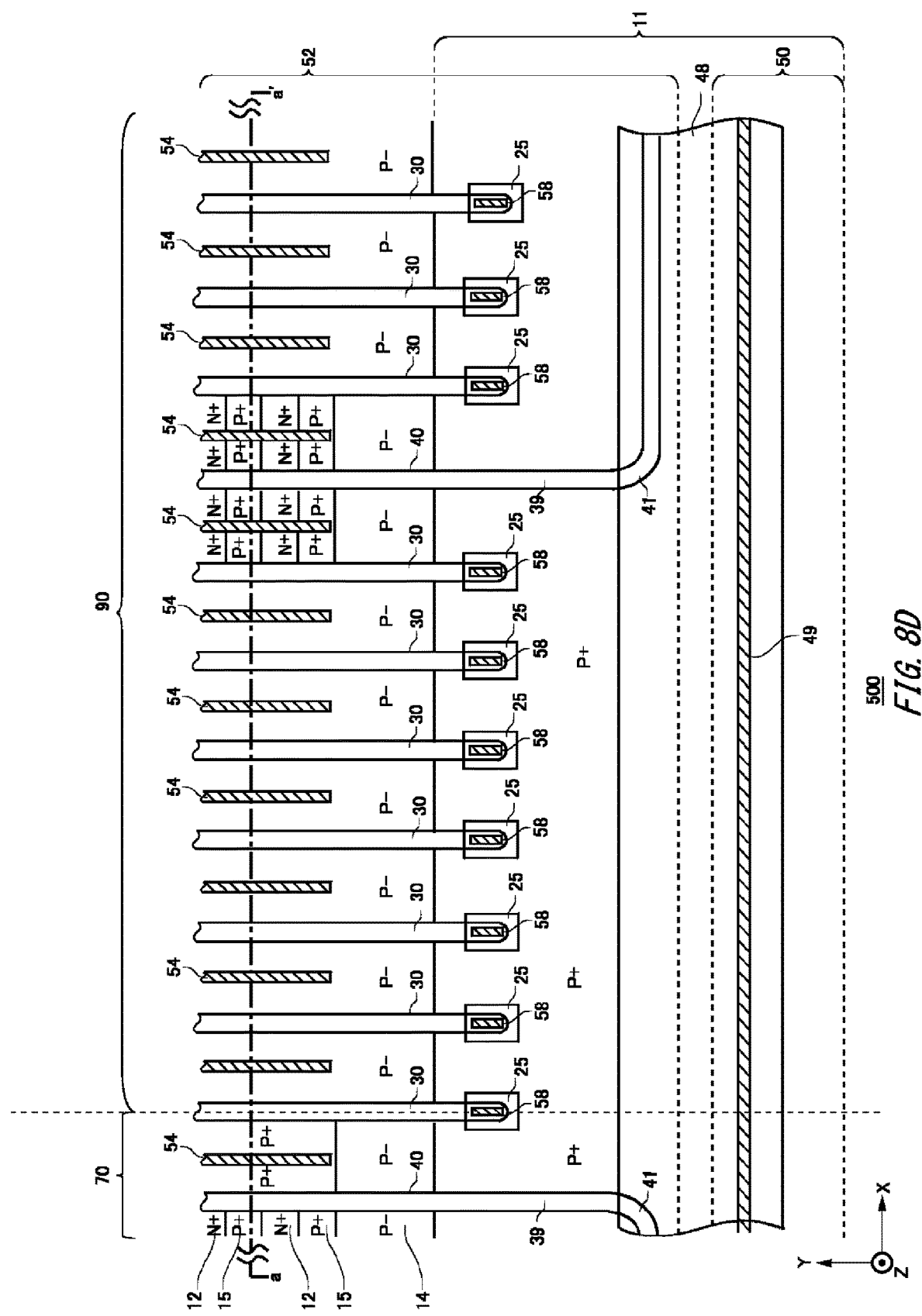
FIG. 8D is a partial top view of the semiconductor device 500.

FIG. 8D is a partial top view of the semiconductor device 500. Similarly to FIG. 8C, FIG. 8D mainly illustrates the injection suppression region 90. FIG. 8D illustrates a variation of the arrangement of the gate trench portion 40 and the dummy trench portion 30 in the injection suppression region 90. The description of the configuration common to FIG. 8C is omitted.

In the example illustrated in FIG. 8D, in the injection suppression region 90, the straight portions 29 of the seven dummy trench portions 30 are disposed between the straight portions 39 of the two gate trench portions 40. The end portions of the two straight portions 39 in the Y axis direction are connected to each other by the edge portion 41 with the gate runner 48.

That is, in the example shown in FIG. 8D, in the injection suppression region 90, one gate trench portion 40 and seven dummy trench portions 30 are alternately disposed in the X axis direction. The dummy ratio in such an arrangement is 87.5%.

In this way, FIG. 8C illustrates the arrangement (structure in which one gate trench portion 40 and three dummy trench portions 30 are alternately disposed in the X axis direction) in which the dummy ratio of the injection suppression region 90 is minimized, and FIG. 8D illustrates the arrangement (structure in which one gate trench portion 40 and seven dummy trench portions 30 are alternately disposed in the X axis direction) in which the dummy ratio of the injection suppression region 90 is maximized.

In the semiconductor device 500, by setting the dummy ratio of the injection suppression region 90 to be higher than that of the transistor portion 70 and to be in the range illustrated in FIG. 8C and FIG. 8D, the injection suppression region 90 partially performs the transistor operation, so that it is possible to suppress the hole injection and improve the reverse recovery loss while suppressing the deterioration of the ON voltage.

Although the present invention has been described using the embodiments, the technical scope of the present invention is not limited to the scope described in the above embodiments. It is apparent to those skilled in the art that various modifications or improvements can be made to the above embodiments. It is apparent from the description of the claims that modes to which such changes or improvements are added can also be included in the technical scope of the present invention.

It should be noted that the order of execution of each processing such as operations, procedures, steps, and stages in the devices, systems, programs, and methods illustrated in the claims, the specification, and the drawings can be realized in any order unless "before", "prior to", or the like is specifically stated, and unless the output of the previous processing is used in the later processing. Even if the operation flow in the claims, the specification, and the drawings is described using "First", "Next", and the like for convenience, it does not mean that it is essential to perform in this order.

EXPLANATION OF REFERENCES

10: substrate; 11: well region; 12: emitter region; 14: base region; 15: extraction region; 16: accumulation region; 17: plug region; 18: drift region; 20: buffer region; 21: front surface; 22: collector region; 23: back surface; 24: collector electrode; 25: connection portion; 29: straight portion; 30: dummy trench portion; 31: edge portion; 32: dummy insulating film; 34: dummy conductive portion; 38: interlayer dielectric film; 39: straight portion; 40: gate trench portion; 41: edge portion; 42: gate insulating film; 44: gate conductive portion; 48: gate runner; 49: contact hole; 50: gate metal layer; 52: emitter electrode; 54: contact hole; 56: contact hole; 58: contact hole; 60: mesa portion; 60a: first mesa portion; 60b: second mesa portion; 60c: third mesa portion 60d: fourth mesa portion; 61: mesa portion; 70: transistor portion; 80: diode portion; 82: cathode region; 90: injection suppression region 94: base region; 100: semiconductor device; 102: end side; 160: active region; 190: edge termination structure portion; 200: semiconductor device; 300: semiconductor device; 400: semiconductor device; 1100: semiconductor device

What is claimed is:
1. A semiconductor device comprising:
a semiconductor substrate including a well region, a transistor portion, and a diode portion,
wherein the transistor portion includes an injection suppression region configured to suppress injection of a carrier of a second conductivity type at an end portion on the diode portion side in a top view of the semiconductor substrate, and the injection suppression region extends along a boundary between the transistor portion and the diode portion;
a plurality of trench portions configured to extend in an extending direction of the transistor portion and the diode portion to be arranged in an arrangement direction,
wherein both the transistor portion and the diode portion have a base region of a second conductivity type in a front surface of the semiconductor substrate,
wherein the transistor portion further includes an emitter region of a first conductivity type and an extraction region of a second conductivity type having a higher doping concentration than the base region in the front surface of the semiconductor substrate,
wherein the plurality of trench portions include gate trench portions and dummy trench portions,
wherein each of the gate trench portions includes gate trench straight portions such that the plurality of trench portions include gate trench straight portions, wherein each of the dummy trench portions includes at least one dummy trench straight portion such that the plurality of trench portions include dummy trench straight portions, and wherein a region including the injection suppression region and extending up to the well region in the extending direction in plan view is not provided with the emitter region and the extraction region from each dummy trench straight portion, located at least in part in the injection suppression region, to another nearest dummy trench straight portion, located at least in part in the injection suppression region, in the arrangement direction of the plurality of trench portions.

2. The semiconductor device according to claim 1, wherein a width of the injection suppression region in an arrangement direction of the transistor portion and the diode portion ranges from 20 μm to 900 μm in a top view of the semiconductor substrate.

3. The semiconductor device according to claim 1, wherein the injection suppression region is further provided between an end portion of the diode portion in the extending direction and an outer periphery of an active region in a top view of the semiconductor substrate.

4. The semiconductor device according to claim 1, wherein an area of the diode portion is 10% or more of a total area of the diode portion and the injection suppression region in a top view of the semiconductor substrate.

5. The semiconductor device according to claim 1, wherein a total area of the diode portion ranges from 1.4% to 22% of an area of the semiconductor device in a top view of the semiconductor substrate.

6. The semiconductor device according to claim 1, wherein a doping concentration of the base region in the injection suppression region is equal to or less than a doping concentration of the base region of the diode portion.

7. The semiconductor device according to claim 6, wherein a doping concentration of the base region in the injection suppression region ranges from $1E+16$ cm$^{-3}$ to $5E+19$ cm$^{-3}$.

8. The semiconductor device according to claim 1, wherein a doping concentration of the base region of the diode portion ranges from $1E+16$ cm$^{-3}$ to $1E+18$ cm$^{-3}$.

9. The semiconductor device according to claim 1, wherein a doping concentration of the extraction region ranges from $5E+18$ cm$^{-3}$ to $5E+20$ cm$^{-3}$.

10. The semiconductor device according to claim 1, wherein the plurality of trench portions include a gate trench portion and a dummy trench portion, and wherein the injection suppression region includes a dummy trench portion and does not include a gate trench portion.

11. The semiconductor device according to claim 1, wherein a dummy ratio is defined as a ratio of the number of dummy trench straight portions to a total number of gate trench straight portions and dummy trench straight portions encountered in cross sectional view in the arrangement direction in a specified portion or region of the semiconductor substrate that is specified when referring to any particular dummy ratio, and wherein the dummy ratio in the injection suppression region is higher than the dummy ratio in the transistor portion excluding the injection suppression region in a cross sectional view in the arrangement direction through the transistor portion and the injection suppression region.

12. The semiconductor device according to claim 11, wherein the dummy ratio in the transistor portion excluding the injection suppression region, in a cross sectional view in the arrangement direction through the transistor portion and the injection suppression region, ranges from 0% to 75%.

13. The semiconductor device according to claim 1, further comprising:
an accumulation region of a first conductivity type inside the semiconductor substrate.

14. The semiconductor device according to claim 1, further comprising:
a mesa defined by a dummy trench portion is provided in the transistor portion adjacent the injection suppression region, wherein the mesa defined by the dummy trench portion in the transistor portion adjacent the injection suppression region is provided with the extraction region.

15. The semiconductor device according to claim 1, wherein the transistor portion includes a collector region and wherein the injection suppression region is provided over the collector region in a top view of the semiconductor substrate.

* * * * *